(12) United States Patent
Choi et al.

(10) Patent No.: US 10,186,552 B2
(45) Date of Patent: Jan. 22, 2019

(54) VARIABLE RESISTANCE MEMORY DEVICE AND METHOD OF MANUFACTURING THE SAME

(71) Applicant: Samsung Electronics Co., Ltd., Suwon-si (KR)

(72) Inventors: Seol Choi, Seoul (KR); Hideki Horii, Seoul (KR); Dong-ho Ahn, Hwaseong-si (KR); Seong-geon Park, Seongnam-si (KR); Dong-jun Seong, Seongnam-si (KR); Min-kyu Yang, Hwaseong-si (KR); Jung-moo Lee, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 38 days.

(21) Appl. No.: 15/446,024

(22) Filed: Mar. 1, 2017

(65) Prior Publication Data
US 2018/0033826 A1 Feb. 1, 2018

(30) Foreign Application Priority Data

Jul. 28, 2016 (KR) .................. 10-2016-0096123

(51) Int. Cl.
*H01L 27/24* (2006.01)
*H01L 45/00* (2006.01)
*G11C 13/00* (2006.01)

(52) U.S. Cl.
CPC ........ *H01L 27/2427* (2013.01); *G11C 13/003* (2013.01); *G11C 13/0004* (2013.01); *G11C 13/0026* (2013.01); *G11C 13/0028* (2013.01); *H01L 27/2463* (2013.01); *H01L 45/06* (2013.01); *H01L 45/1233* (2013.01); *H01L 45/1253* (2013.01); *H01L 45/143* (2013.01); *H01L 45/144* (2013.01); *G11C 2213/52* (2013.01); *G11C 2213/71* (2013.01); *G11C 2213/72* (2013.01); *G11C 2213/73* (2013.01); *G11C 2213/76* (2013.01)

(58) Field of Classification Search
CPC . H01L 27/24; H01L 27/2427; H01L 27/2463; H01L 45/1233; H01L 45/1253; H01L 45/144; H01L 45/143; H01L 45/06
See application file for complete search history.

(56) References Cited

U.S. PATENT DOCUMENTS 7,858,152 B2   12/2010   Ovshinsky et al.
8,299,450 B2   10/2012   Ahn et al.
(Continued)

FOREIGN PATENT DOCUMENTS

KR   10-1603505   3/2016

*Primary Examiner* — Thanhha Pham
(74) *Attorney, Agent, or Firm* — Muir Patent Law, PLLC

(57) ABSTRACT

A variable resistance memory device may include: a first electrode layer; a selection device layer on the first electrode layer, the selection device layer including a chalcogenide switching material consisting essentially of germanium (Ge), selenium (Se), and antimony (Sb), wherein a content of the Ge is less than a content of the Se based on an atomic weight; a second electrode layer on the selection device layer; a variable resistance layer on the second electrode layer, the variable resistance layer including a chalcogenide material; and a third electrode layer on the variable resistance layer.

20 Claims, 25 Drawing Sheets

(56) References Cited

U.S. PATENT DOCUMENTS

| | | |
|---|---|---|
| 8,611,146 B2 | 12/2013 | Campbell |
| 8,982,604 B2 | 3/2015 | Lee et al. |
| 9,012,876 B2 | 4/2015 | Zheng |
| 9,337,422 B2 | 5/2016 | Cheong et al. |
| 9,842,882 B1 * | 12/2017 | Kim .................... H01L 27/2463 |
| 2013/0336042 A1 * | 12/2013 | Lee .................... H01L 45/1253 |
| | | 365/148 |
| 2017/0244026 A1 * | 8/2017 | Wu ........................ H01L 43/12 |
| 2017/0271581 A1 * | 9/2017 | Seong ................... H01L 27/224 |

* cited by examiner

4X – 4X'

VARIABLE RESISTANCE MEMORY DEVICE AND METHOD OF MANUFACTURING THE SAME

CROSS-REFERENCE TO RELATED APPLICATION

This application claims the benefit of Korean Patent Application No. 10-2016-0096123, filed on Jul. 28, 2016, in the Korean Intellectual Property Office, the disclosure of which is incorporated herein in its entirety by reference.

BACKGROUND

The exemplary embodiments herein described relate to a variable resistance memory device, and more particularly, to a variable resistance memory device including a selection device including a chalcogenide material essentially consisting of germanium (Ge), selenium (Se), and antimony (Sb), and a method of manufacturing the variable resistance memory device.

A variable resistance memory device including a selection device having chalcogenide material have been developed. Generally, when a voltage is applied to the selection device including the chalcogenide material in a non-crystalline phase, an electron structure of the selection device may be changed. Thus, the electrical properties of the selection device may also be changed from a non-conducting state to a conducting state. When the applied voltage is removed, the electrical properties of the selection device may be restored to the original non-conducting state. The chalcogenide material in the selection device having such electrical properties has typically included arsenic (As). However, since As is not environmentally friendly, a new material to replace As is needed.

SUMMARY

Accordingly, the herein described exemplary embodiments have developed a variable resistance memory device that substitutes antimony (Sb) for arsenic (As) so that the selection device includes a chalcogenide material essentially consisting of germanium (Ge), selenium (Se), and antimony (Sb).

In addition, the herein described exemplary embodiments provide a method of manufacturing a variable resistance memory device including a selection device including the chalcogenide material essentially consisting of Ge, Se, and Sb.

Aspects of the exemplary embodiments should not be limited by the description herein, as other unmentioned aspects will be clearly understood by one of ordinary skill in the art from the exemplary embodiments described herein.

According to an aspect of an exemplary embodiment, there is provided a variable resistance memory device including: a first electrode layer; a selection device layer on the first electrode layer, the selection device layer including a chalcogenide switching material consisting essentially of germanium (Ge), selenium (Se), and antimony (Sb), wherein a content of the Ge is less than a content of the Se based on atomic weight; a second electrode layer on the selection device layer; a variable resistance layer on the second electrode layer, the variable resistance layer including a chalcogenide material; and a third electrode layer on the variable resistance layer.

According to another aspect of an exemplary embodiment, there is provided a variable resistance memory device including: a first electrode line layer extending in a first direction, the first electrode line layer including a plurality of first electrode lines spaced apart from one another; a second electrode line layer above the first electrode line layer, the second electrode line layer extending in a second direction different from the first direction and including a plurality of second electrode lines spaced apart from one another; a third electrode line layer above the second electrode line layer, the third electrode line layer including the plurality of first electrode lines; a first memory cell layer between the first electrode line layer and the second electrode line layer, the first memory cell layer including a plurality of memory cells located at intersections between the first electrode lines and the second electrode lines; and a second memory cell layer between the second electrode line layer and the third electrode line layer, the second memory cell layer including a plurality of memory cells located at the intersections between the first electrode lines and the second electrode lines, wherein each of the plurality of memory cells includes a selection device layer, an electrode layer, and a variable resistance layer, and the selection device layer includes a chalcogenide switching material including $(Ge_xSe_{1-x})_ySb_{1-y}$, in which x is equal to or greater than about 0.2 and less than about 0.5, and y is about 0.85 to about 0.95.

BRIEF DESCRIPTION OF THE DRAWINGS

Exemplary embodiments will be more clearly understood from the following detailed description taken in conjunction with the accompanying drawings in which.

DETAILED DESCRIPTION

Figure 1:
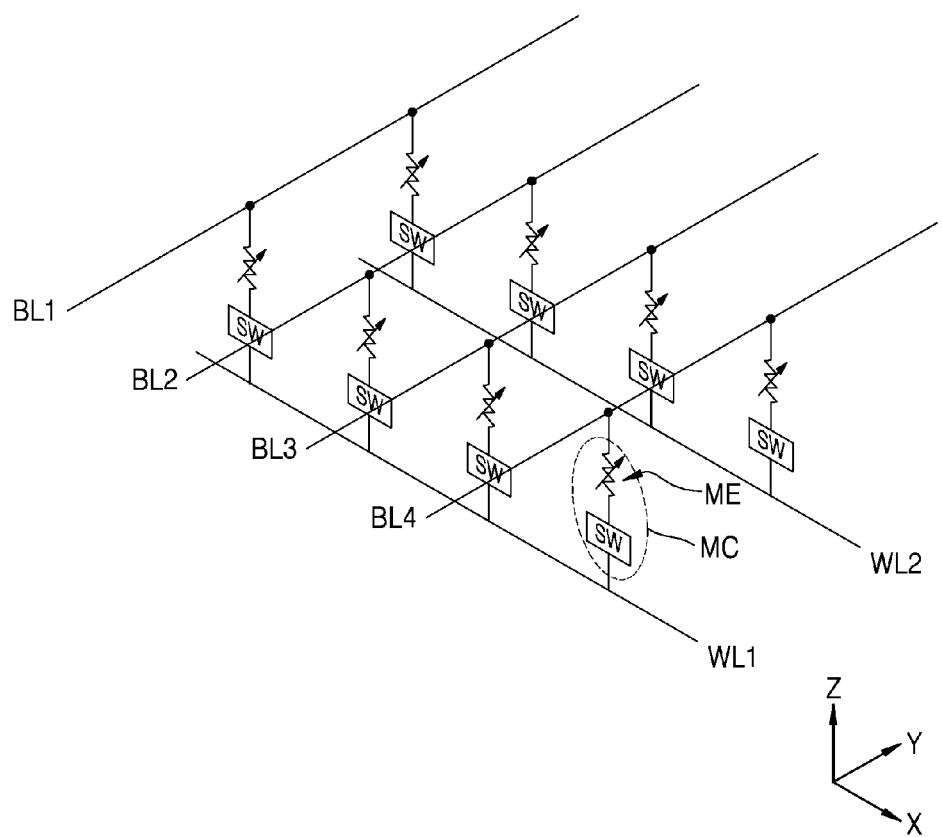
FIG. 1 is an equivalent circuit diagram of a variable resistance memory device according to an exemplary embodiment.

The present disclosure now will be described more fully hereinafter with reference to the accompanying drawings, in which various exemplary implementations are shown. The invention may, however, be embodied in many different forms and should not be construed as limited to the example embodiments. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary implementations, these figures are not necessarily intended to be mutually exclusive from each other. Rather, as will be seen from the context of the detailed description below, certain features depicted and described in different figures can be combined with other features from other figures to result in various exemplary embodiments, when taking the figures and their description as a whole into consideration.

Although the figures described herein may be referred to using language such as "one exemplary embodiment," or "certain exemplary embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

The terminology used herein is for the purpose of describing particular exemplary embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Exemplary embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

Components described as thermally connected or in thermal communication are arranged such that heat will follow a path between the components to allow the heat to transfer from the first component to the second component. Simply because two components are part of the same device or package does not make them thermally connected. In general, components which are heat-conductive and directly connected to other heat-conductive or heat-generating components (or connected to those components through intermediate heat-conductive components or in such close proximity as to permit a substantial transfer of heat) will be described as thermally connected to those components, or in thermal communication with those components. On the contrary, two components with heat-insulative materials therebetween, which materials significantly prevent heat transfer between the two components, or only allow for incidental heat transfer, are not described as thermally connected or in thermal communication with each other. The terms "heat-conductive" or "thermally-conductive" do not apply to a particular material simply because it provides incidental heat conduction, but are intended to refer to materials that are typically known as good heat conductors or known to have utility for transferring heat, or components having similar heat conducting properties as those materials.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

As is traditional in the field of the disclosed technology, features and exemplary implementations are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts.

Further, the blocks, units and/or modules of the exemplary embodiments may be physically combined into more complex blocks, units and/or modules without departing from the scope of the inventive concepts.

FIG. 1 is an equivalent circuit diagram of a variable resistance memory device 100 according to an exemplary embodiment.

As shown in FIG. 1, the variable resistance memory device 100 may include word lines WL1 and WL2, which may extend in a first direction (X direction) and be spaced apart from each other in a second direction (Y direction) perpendicular to the first direction. In addition, the variable resistance memory device 100 may include bit lines BL1, BL2, BL3, and BL4, which may be spaced apart from the word lines WL1 and WL2 in a third direction (Z direction) and extend in the second direction.

Memory cells MC may be respectively located between the bit lines BL1, BL2, BL3, and BL4 and the word lines WL1 and WL2. In detail, the memory cells MC may be located at intersections between the bit lines BL1, BL2, BL3, and BL4 and the word lines WL1 and WL2, and include a variable resistance layer ME configured to store information and a selection device layer SW configured to select the memory cell MC. The selection device layer SW may be referred to as a switching device layer or an access device layer.

The memory cells MC may have the same structures arranged in the third direction. For example, in the memory cells MC located between the word line WL1 and the bit line BL1, the selection device layer SW may be electrically connected to the word line WL1, the variable resistance layer ME may be electrically connected to the bit line BL1, and the variable resistance layer ME and the selection device layer SW may be connected to each other in series. However, the above described exemplary implementations are not limited thereto. For example, unlike the exemplary embodiment shown in FIG. 1, positions of the selection device layer SW and the variable resistance layer ME may be exchanged in the memory cell MC. For example, in a memory cell MC1, the variable resistance layer ME may be connected to the word line WL1, and the selection device layer SW may be connected to the bit line BL1.

A method of driving the variable resistance memory device 100 will be briefly described. A voltage may be applied to the variable resistance layer ME of the memory cell MC through the word lines WL1 and WL2 and the bit lines BL1, BL2, BL3, and BL4 so that current may flow into the variable resistance layer ME. For example, the variable resistance layer ME may include a phase-change material layer, which may be reversibly switched between a first state and a second state. However, the variable resistance layer ME is not limited thereto and may include any variable resistor of which a resistance varies according to an applied voltage. For example, in a selected memory cell MC, a resistance of the variable resistance layer ME may be reversibly switched between the first state and the second state according to a voltage applied to the variable resistance layer ME.

Digital information, such as '0' or '1', may be stored in the memory cell MC depending on a variation in a resistance of the variable resistance layer ME. In addition, digital information may be erased from the memory cell MC. For example, a high-resistance state '0' and a low-resistance state '1' may be written as data in the memory cell MC. An operation of changing a high-resistance state '0' into a low-resistance state '1' may be referred to as a 'set operation', and an operation of changing a low-resistance state '1' into a high-resistance state '0' may be referred to as a 'reset operation'. However, the memory cell MC according to an exemplary embodiment is not limited to the above-described digital information (i.e., the high-resistance state '0' and the low-resistance state '1'), and may store other various resistance states.

An arbitrary memory cell MC may be addressed by selecting the word lines WL1 and WL2 and the bit lines BL1, BL2, BL3, and BL4. The memory cell MC may be programmed by applying a certain signal between the word lines WL1 and WL2 and the bit lines BL1, BL2, BL3, and BL4. In addition, information (i.e., programmed information) corresponding to a resistance of the variable resistance layer ME of the memory cell MC may be read by measuring a current passing through the bit lines BL1, BL2, BL3, and BL4.

Figure 2:
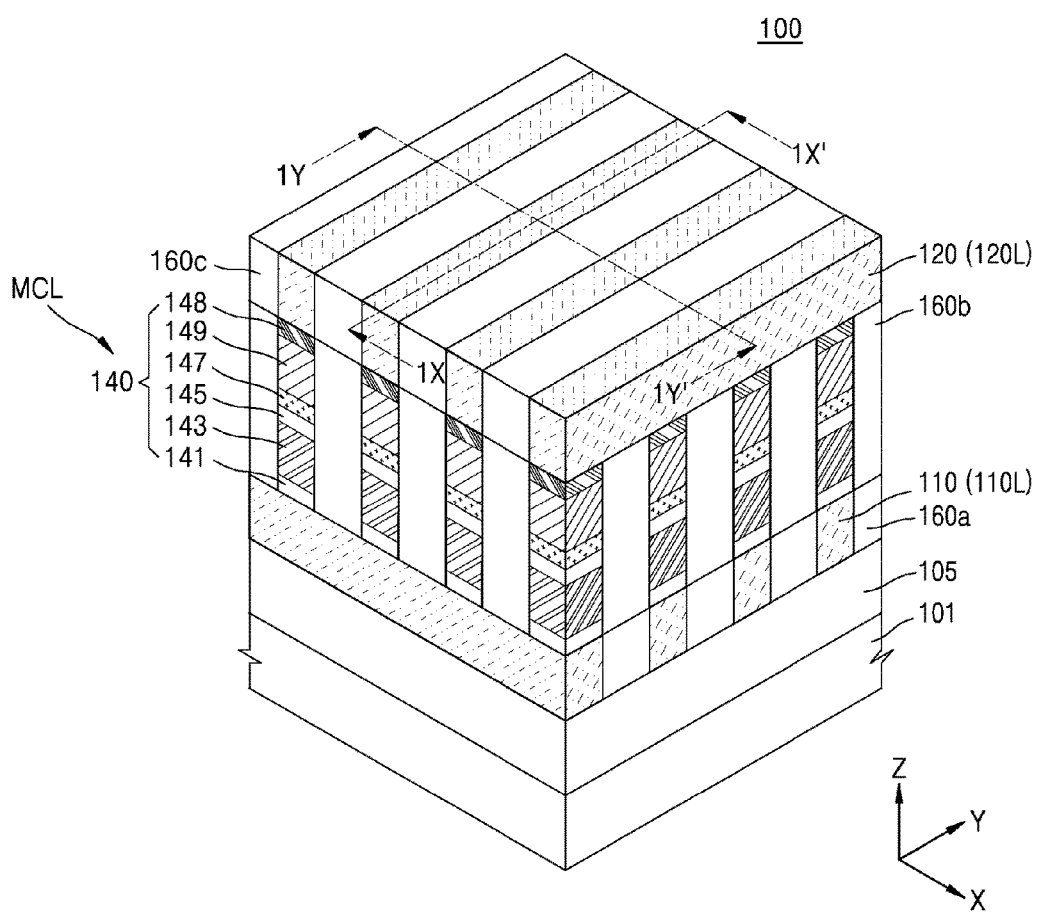
FIG. 2 is a perspective view of a variable resistance memory device according to an exemplary embodiment.
Figure 3:
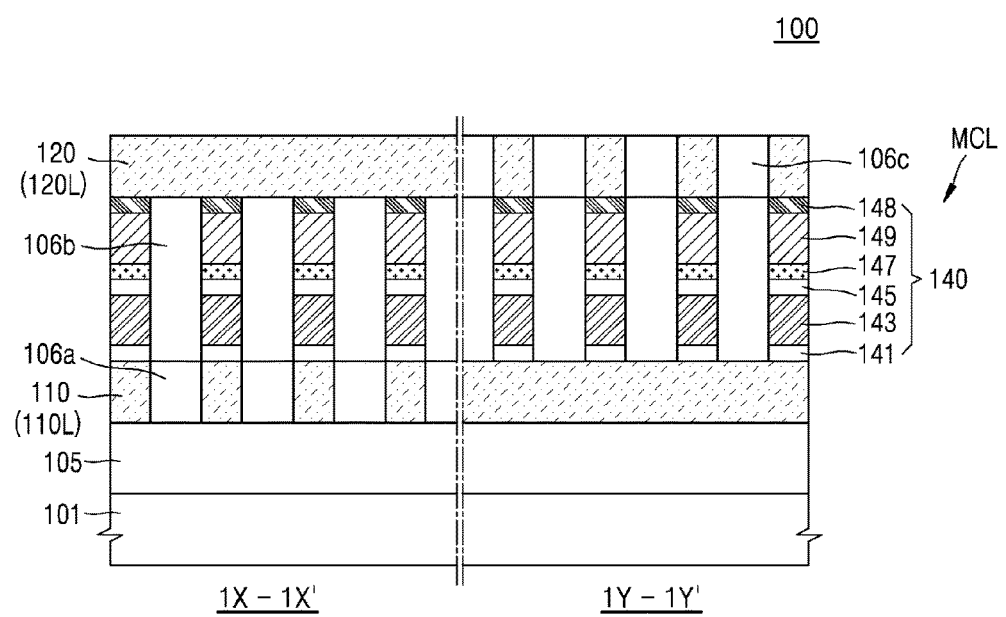
FIG. 3 is a cross-sectional view taken along lines 1X-1X' and 1Y-1Y' of FIG. 2.

FIG. 2 is a perspective view of a variable resistance memory device 100 according to an exemplary embodiment, and FIG. 3 is a cross-sectional view taken along lines 1X-1X' and 1Y-1Y' of FIG. 2. As shown in FIGS. 2 and 3, the variable resistance memory device 100 may include a first electrode line layer 110L, a second electrode line layer 120L, and a memory cell layer MCL, which are located above a substrate 101.

A first interlayer insulating layer 105 may be located on the substrate 101. The first interlayer insulating layer 105 may include an oxide (e.g., silicon oxide) or a nitride (e.g., silicon nitride), and serve to electrically isolate the first electrode line layer 110L from the substrate 101. In the variable resistance memory device 100 according to the present exemplary embodiment, the first interlayer insulating layer 105 may be located on the substrate 101, but the present exemplary embodiment is not limited thereto. For example, in the variable resistance memory device 100 according to the present exemplary embodiment, an integrated circuit (IC) layer may be located on the substrate 101, and the memory cells MC may be located on the IC layer. The IC layer may include, for example, peripheral circuits for operations of the memory cells and/or a core circuit for calculations. For reference, a structure in which an IC layer including peripheral circuits and/or a core circuit is located on a substrate, and memory cells are located on the IC layer may be referred to as a Cell on Peri (COP) structure.

The first electrode line layer 110L may include a plurality of first electrode lines 110, which may extend parallel to one another in the first direction (X direction). The second electrode line layer 120L may include a plurality of second electrode lines 120, which may extend parallel to one another in the second direction (Y direction) that may intersect the first direction. The first direction may cross the second direction at right angles.

Operations of the variable resistance memory device 100 will now be described. The first electrode lines 110 may correspond to word lines (refer to WL in FIG. 1), and the second electrode lines 120 may correspond to bit lines (refer to BL in FIG. 1). Conversely, the first electrode lines 110 may correspond to the bit lines, and the second electrode lines 120 may correspond to the word lines.

Each of the first electrode lines 110 and the second electrode lines 120 may include a metal, a conductive metal nitride, a conductive metal oxide, or a combination thereof. For example, each of the first electrode lines 110 and the second electrode lines 120 may include tungsten (W), tungsten nitride (WN), gold (Au), silver (Ag), copper (Cu), aluminium (Al), titanium aluminium nitride (TiAlN), iridium (Ir), platinum (Pt), palladium (Pd), ruthenium (Ru), zirconium (Zr), rhodium (Rh), nickel (Ni), cobalt (Co), chromium (Cr), tin (Sn), zinc (Zn), indium tin oxide (ITO), an alloy thereof, or a combination thereof. In addition, each of the first electrode lines 110 and the second electrode lines 120 may include a metal layer and a conductive barrier layer covering at least a portion of the metal layer. The conductive barrier layer may include, for example, titanium (Ti), titanium nitride (TiN), tantalum (Ta), tantalum nitride (TaN), or a combination thereof.

The memory cell layer MCL may include a plurality of memory cells 140 (refer to MC in FIG. 1), which may be spaced apart from one another in the first direction and the second direction. As shown, the first electrode lines 110 may intersect the second electrode lines 120. The memory cells 140 may be located between the first electrode line layer 110L and the second electrode line layer 120L at intersections between the first electrode lines 110 and the second electrode lines 120.

The memory cells 140 may have square pillar structures. However, the memory cells 140 are not limited to the square pillar structures. For example, the memory cells 140 may have various other pillar structures, such as cylindrical structures, elliptical pillar structures, or polygonal pillar structures. In addition, the memory cells 140 may have lower portions wider than upper portions or have upper portions wider than lower portions according to a forming method. For example, when the memory cells 140 are formed by using an etching process, the memory cells 140 may have lower portions wider than upper portions. In addition, when the memory cells 140 are formed by using a damascene process, the memory cells 140 may have upper portions wider than lower portions. Naturally, in the etching process or the damascene process, material layers may be etched by precisely controlling an etching operation so that side surfaces of the memory cells 140 are almost vertical and upper portions of the memory cells 140 are almost as wide as lower portions thereof. For the sake of convenience, FIGS. 2 and 3 and all the following drawings illustrate a case in which the side surfaces of the memory cells 140 are vertical. However, the memory cells 140 may have lower portions wider than upper portions or have upper portions wider than lower portions.

Each of the memory cells 140 may include a lower electrode layer 141, a selection device layer 143, a middle electrode layer 145, a heating electrode layer 147, a variable resistance layer 149, and an upper electrode layer 148. When positional relationships are not considered, the lower electrode layer 141 may be referred to as a first electrode layer, the middle electrode layer 145 and the heating electrode layer 147 may be referred to as second electrode layers, and the upper electrode layer 148 may be referred to as a third electrode layer.

In some exemplary embodiments, the variable resistance layer 149 (refer to ME in FIG. 1) may include a phase-change material, which may be reversibly switched between an amorphous state and a crystalline state according to a heating time. For example, a phase of the variable resistance layer 149 may be reversibly changed due to Joule heat generated due to a voltage applied to both ends of the variable resistance layer 149, and the variable resistance layer 149 may include a phase-change material of which a resistance may vary according to the phase change. Specifically, the phase-change material may be put into a high-resistance state in an amorphous phase, and put into a low-resistance state in a crystalline phase. By defining the high-resistance state as '0' and defining the low-resistance state as '1', data may be stored in the variable resistance layer 149.

In some exemplary embodiments, the variable resistance layer 149 may include a chalcogenide material serving as a phase-change material. For example, the variable resistance layer 149 may include germanium-antimony-tellurium (Ge—Sb—Te, abbreviated to GST). As used herein, hyphenated (—) chemical compositions may denote elements included in specific mixtures or compounds and refer to all chemical formulas including the denoted elements. For example, GST may refer to materials, such as $Ge_2Sb_2Te_5$, $Ge_2Sb_2Te_7$, $Ge_1Sb_2Te_4$, or $Ge_1Sb_4Te_7$.

In addition to Ge—Sb—Te (GST), the variable resistance layer 149 may include various other chalcogenide materials. For example, the variable resistance layer 149 may include the chalcogenide material including at least two selected out of silicon (Si), germanium (Ge), antimony (Sb), tellurium (Te), bismuth (Bi), indium (In), Sn, and selenium (Se) or a combination thereof.

Each element included in the variable resistance layer 149 may have various stoichiometric compositions. A crystallization temperature and a melting point, a phase change rate relative to crystallization energy, and data retention of the variable resistance layer 149 may be controlled according to a stoichiometric composition of each element.

In addition, the variable resistance layer 149 may further include impurities of at least one selected out of boron (B), carbon (C), nitrogen (N), oxygen (O), phosphorus (P), and sulfur (S). A driving current of the variable resistance memory device 100 may vary due to the impurities. In addition, the variable resistance layer 149 may further include a metal. For example, the variable resistance layer 149 may include at least one selected out of Al, gallium (Ga), Zn, Ti, Cr, manganese (Mn), iron (Fe), Co, Ni, molybdenum (Mo), Ru, Pd, hafnium (Hf), Ta, Ir, Pt, Zr, thallium (Tl), and polonium (Po). The above-described metals may increase electrical conductivity and thermal conductivity of the variable resistance layer 149, thereby increasing a crystallization rate and a set rate. In addition, the above-described metals may improve data retention of the variable resistance layer 149.

The variable resistance layer 149 may have a multi-layered structure formed by stacking at least two layers having different physical properties. The number and thicknesses of a plurality of layers included in the variable resistance layer 149 may be freely selected. A barrier layer may be further formed between the plurality of layers. The barrier layer may prevent diffusion of materials between the plurality of layers. In other words, the barrier layer may reduce diffusion of a preceding layer during formation of a subsequent layer from among the plurality of layers.

In addition, the variable resistance layer 149 may have a super-lattice structure formed by alternately stacking a plurality of layers including different materials. For example, the variable resistance layer 149 may include a structure formed by alternately stacking a first layer including germanium-tellurium (Ge—Te) and a second layer including antimony-tellurium (Sb—Te). However, materials included in the first layer and the second layer are not limited to Ge—Te and Sb—Te but may include the above-described various materials.

Although the present embodiment describes an example in which the variable resistance layer 149 includes a phase-change material, other exemplary embodiments of the herein described subject matter are not limited thereto. The variable resistance layer 149 included in the variable resistance memory device 100 may include various materials having resistance variation characteristics.

In some exemplary embodiments, when the variable resistance layer 149 includes a transition metal oxide, the variable resistance memory device 100 may be a resistive RAM (ReRAM). At least one electrical path may be generated or annihilated in the variable resistance layer 149 including the transition metal oxide due to a program operation. When the electrical path is generated, the variable resistance layer 149 may have a low resistance value. When the electrical path is annihilated, the variable resistance layer 149 may have a high resistance value. The variable resistance memory device 100 may store data by using a resistance difference of the variable resistance layer 149.

When the variable resistance layer 149 includes a transition metal oxide, the transition metal oxide may include at least one metal selected from the group consisting of Ta, Zr, Ti, Hf, Mn, Y, Ni, Co, Zn, niobium (Nb), Cu, Fe, or Cr. For example, the transition metal oxide may include a single- or a multi-layered structure including at least one selected out of $Ta_2O_{5-x}$, $ZrO_{2-x}$, $TiO_{2-x}$, $HfO_{2-x}$, $MnO_{2-x}$, $Y_2O_{3-x}$, $NiO_{1-y}$, $Nb_2O_{5-x}$, $CuO_{1-y}$, or $Fe_2O_{3-x}$. In the above-described materials, x may be selected in the range of $0 \le x \le 1.5$, and y may be selected in the range of $0 \le y \le 0.5$. However, the inventive concept is not limited thereto.

In some exemplary embodiments, when the variable resistance layer 149 has a magnetic tunnel junction (MTJ) structure including two electrodes including a magnetic material and a dielectric material interposed between the two electrodes, the variable resistance memory device 100 may be a magnetic RAM (MRAM).

The two electrodes may be respectively a pinned magnetic layer and a free magnetic layer, and the dielectric material between the two electrodes may be a tunnel barrier layer. The pinned magnetic layer may have a pinned magnetization direction, while the free magnetic layer may have a variable magnetization direction, which may be parallel to or anti-parallel to the magnetization direction of the pinned magnetic layer. The magnetization directions of the pinned magnetic layer and the free magnetic layer may be parallel to one surface of the tunnel barrier layer, but are not limited thereto. The magnetization directions of the pinned magnetic layer and the free magnetic layer may be perpendicular to one surface of the tunnel barrier layer.

When the magnetization direction of the free magnetic layer is parallel to the magnetization direction of the pinned magnetic layer, the variable resistance layer 149 may have a first resistance value. In another case, when the magnetization direction of the free magnetic layer is anti-parallel to the magnetization direction of the pinned magnetic layer, the variable resistance layer 149 may have a second resistance value. The variable resistance memory device 100 may store data by using a difference between the first and second resistance values. The magnetization direction of the free magnetic layer may vary due to spin torque of electrons in a program current.

Each of the pinned magnetic layer and the free magnetic layer may include a magnetic material. In this case, the pinned magnetic layer may further include an anti-ferromagnetic material capable of pinning a magnetization direction of a ferromagnetic material included in the pinned magnetic layer. The tunnel barrier layer may include any one oxide selected out of magnesium (Mg), Ti, Al, magnesium zinc (MgZn), and magnesium boron (MgB), but is not limited to the examples.

The selection device layer 143 (refer to SW in FIG. 1) may be a current adjusting layer capable of adjusting the flow of current. The selection device layer 143 may include a material layer of which a resistance may vary according to a magnitude of a voltage applied to both ends of the selection device layer 143. For example, the selection device layer 143 may include an ovonic threshold switching (OTS) material. Functions of the selection device layer including the OTS material will be briefly described. When a voltage lower than a threshold voltage $V_{th}$ is applied to the selection device layer 143, the selection device layer 143 may maintain a high-resistance state in which current hardly flows. When a voltage higher than the threshold voltage $V_{th}$ is applied to the selection device layer 143, the selection device layer 143 may be put into a low-resistance state so that current may start to flow. In addition, when current flowing through the selection device layer 143 is smaller than a holding current, the selection device layer 143 may change into a high-resistance state.

The selection device layer 143 may include a chalcogenide switching material, which is the OTS material. In the present example embodiment, the chalcogenide switching material may not include arsenic (As) and essentially consist of Ge, Se, and Sb. In addition, the selection device layer comprises the chalcogenide switching material into which at least one selected out of C and N is further doped.

In general, chalcogen elements may be characterized by divalent bonding and the presence of lone pair electrons. The divalent bonding of chalcogen elements may lead to formation of chain and ring structures to form the chalcogenide material, and the lone pair electrons may provide an electron source for forming conductive filaments. For example, triatomic and tetratomic modifiers, for example, Al, Ga, In, Ge, Sn, Si, P, and Sb, may be included in the chain and ring structures of the chalcogen elements and determine structural rigidity of the chalcogenide material. The chalcogenide material may be categorized as either the chalcogenide switching material or a chalcogenide phase-change material depending on crystallinity or other structural redistribution capability.

The heating electrode layer 147 may be located between the middle electrode layer 145 and the variable resistance layer 149 and contact the variable resistance layer 149. The heating electrode layer 147 may function to heat the variable resistance layer 149 during a set operation or a reset operation. The heating electrode layer 147 may include a conductive material capable of generating sufficient heat to change phase of the variable resistance layer 149. The heating electrode layer 147 may include a carbon-based conductive material. In some example embodiments, the heating electrode layer 147 may include metals having high melting points or nitrides thereof, such as TiN, titanium silicon nitride (TiSiN), TiAlN, tantalum silicon nitride (TaSiN), tantalum aluminium nitride (TaAlN), TaN, tungsten silicon (WSi), WN, titanium tungsten (TiW), molybdenum nitride (MoN), niobium nitride (NbN), titanium bismuth nitride (TiBN), zirconium silicon nitride (ZrSiN), tungsten silicon nitride (WSiN), tungsten bismuth nitride (WBN), zirconium aluminium nitride (ZrAlN), molybdenum aluminium nitride (MoAlN), titanium aluminium (TiAl), titanium oxynitride (TiON), titanium aluminium oxynitride (TiAlON), tungsten oxynitride (WON), tantalum oxynitride (TaON), C, silicon carbide (SiC), silicon carbon nitride (SiCN), carbon nitride (CN), titanium carbon nitride (TiCN), tantalum carbon nitride (TaCN), or a combination thereof. Other material or materials may be included so the heating electrode layer 147 is not limited to the above-described materials.

The lower electrode layer 141, the middle electrode layer 145, and the upper electrode layer 148 may function as a current path and include a conductive material. For example, each of the lower electrode layer 141, the middle electrode layer 145, and the upper electrode layer 148 may include a metal, a conductive metal nitride, a conductive metal oxide, or a combination thereof. For example, each of the lower electrode layer 141, the middle electrode layer 145, and the upper electrode layer 148 may include at least one selected out of C, TiN, TiSiN, TiCN, titanium carbon silicon nitride (TiCSiN), TiAlN, Ta, TaN, W, and WN, but is not limited thereto.

The lower electrode layer 141 and the upper electrode layer 148 may be selectively formed. In other words, the lower electrode layer 141 and the upper electrode layer 148 may be omitted. However, to prevent generation of contamination or contact failures due to a direct contact of the selection device layer 143 and the variable resistance layer 149 with the first and second electrode lines 110 and 120, the lower electrode layer 141 and the upper electrode layer 148 may be located between the first and second electrode lines 110 and 120 and the selection device layer 143 and the variable resistance layer 149.

Meanwhile, the middle electrode layer 145 may be provided to prevent transmission of heat from the heat electrode layer 147 to the selection device layer 143. In general, the selection device layer 143 may include the chalcogenide switching material that is in an amorphous state. However, with the downscaling of the variable resistance memory device 100, thicknesses and widths of the variable resistance layer 149, the selection device layer 143, the heating electrode layer 147, and the middle electrode layer 145 and distances therebetween may be reduced. Accordingly, during an operation of the variable resistance memory device 100, when a phase of the variable resistance layer 149 is changed due to heat generated by the heating electrode layer 147, the selection device layer 143 located adjacent to the heating electrode layer 147 may be affected by the generated heat. For example, the selection device layer 143 may be partially crystallized by heat generated by the heating electrode layer 147 adjacent to the selection device layer 143. Thus, the selection device layer 143 may be degraded and damaged.

In the variable resistance memory device 100 according to the present exemplary embodiment, the middle electrode layer 145 may be formed to a great thickness so that heat generated by the heating electrode layer 147 may not be transmitted to the selection device layer 143. FIGS. 2 and 3 illustrate an example in which the middle electrode layer 145 is formed to a similar thickness to a thickness of the lower electrode layer 141 or the upper electrode layer 148. However, the middle electrode layer 145 may be formed to a greater thickness than the lower electrode layer 141 or the upper electrode layer 148 so as to prevent transmission of heat. For example, the middle electrode layer 145 may have a thickness of about 10 nm to about 100 nm, but is not limited thereto. In addition, the middle electrode layer 145 may include at least one thermal barrier layer so as to prevent transmission of heat. When the middle electrode layer 145 includes at least two thermal barrier layers, the middle electrode layer 145 may have a structure formed by alternately stacking thermal barrier layers and electrode material layers.

A first insulating layer 160a may be located between the first electrode lines 110, while the second insulating layer 160b may be located between the memory cells 140 of the memory cell layer MCL. In addition, a third insulating layer 160c may be located between the second electrode lines 120. The first to third insulating layers 160a to 160c may include the same material. Alternatively, at least one of the first to third insulating layers 160a to 160c may include a different material from the remaining insulating layers. The first to third insulating layers 160a to 160c may include, for example, a dielectric material, such as an oxide or a nitride, and serve to electrically isolate devices of each layer from one another. Meanwhile, air gaps (not shown) may be formed instead of the second insulating layer 160b. When the air gaps are formed, an insulating liner (not shown) having a certain thickness may be formed between the air gaps and the memory cells 140.

Figure 4A:
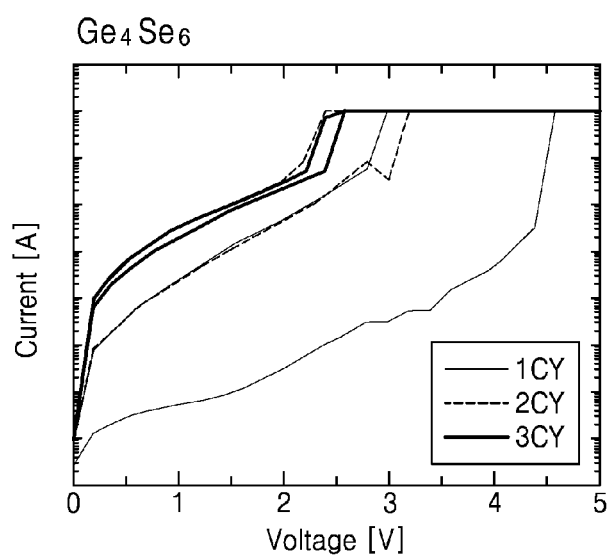
FIG. 4A is a graph illustrating voltage-current curves according to atomic percentages of germanium (Ge) and selenium (Se) in a selection device layer.
Figure 4B:
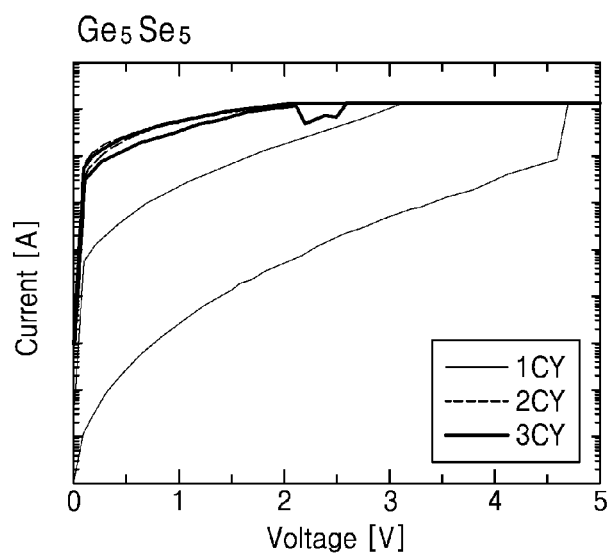
FIG. 4B is a graph illustrating voltage-current curves according to atomic percentages of Ge and Se in the selection device layer.
Figure 4C:
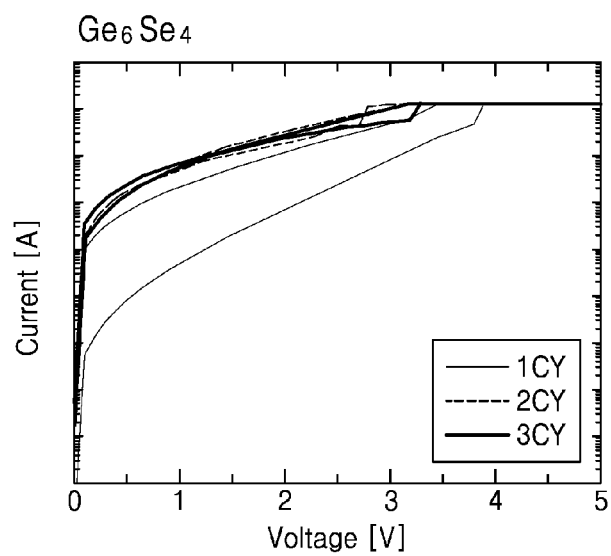
FIG. 4C is a graph illustrating voltage-current curves according to atomic percentages of Ge and Se in the selection device layer.

FIGS. 4A to 4C are graphs illustrating voltage-current curves according to atomic percentages of germanium (Ge) and selenium (Se) in the selection device layer 143.

As shown in FIGS. 4A to 4C, for binary chalcogenide switching materials consisting of Ge and Se, graphs illustrate results of applying a DC voltage sweep to chalcogenide switching materials having different compositions from each other according to changes in atomic percentages.

The DC voltage sweep denotes measuring current changes according to varying voltages applied to the selection device layer (refer to 143 in FIG. 3). Graphs show current changes according to increasing voltages from about 0 V to about 5 V applied to the selection device layer 143. The DC voltage sweep has been performed three times to chalcogenide switching materials having respectively different atomic percentages of Ge and Se, and operations as a selection device are identified based on a third cycle.

The binary chalcogenide switching material consisting of Ge and Se may be formed via, for example, a sputtering method using a target having a certain composition. In addition, in the binary chalcogenide switching material consisting of Ge and Se, atomic percentages of Ge and Se may be analyzed via an X-ray fluorescence analysis (XRF) and/or the Rutherford backscattering spectrometry (RBS).

In FIGS. 4A to 4C, graphs illustrate measurements of voltage-current characteristics by varying atomic percentages of Ge and Se. FIG. 4A is a graph illustrating voltage-current curves of the chalcogenide switching material having a composition of $Ge_4Se_6$, FIG. 4B is a graph illustrating voltage-current curves of the chalcogenide switching material having a composition of $Ge_5Se_5$, and FIG. 4C is a graph illustrating voltage-current curves of the chalcogenide switching material having a composition of $Ge_6Se_4$.

In other words, operations of the selection device are identified for three cases. FIG. 4A is for a case wherein the atomic percentage of Ge is less than that of Se, FIG. 4B is for a case of wherein the atomic percentage of Ge is equal to that of Se, and FIG. 4C is for a case wherein the atomic percentage of Ge is greater than that of Se.

A switching characteristic of the selection device has been observed in the chalcogenide switching material having the composition of $Ge_4Se_6$ of FIG. 4A, that is, in the case wherein the atomic percentage of Ge is less than that of Se. Since an important element for a characteristic of the selection device is Se, the chalcogenide switching material having a composition in which a content of Ge is less than a content of Se may be used as the selection device. In the case of the chalcogenide switching material having the composition of $Ge_4Se_6$ of FIG. 4A, the threshold voltage $V_{th}$ may be approximately about 2.4 V.

In contrast, the switching characteristic of the selection device has not been observed in voltage-current curves of chalcogenide switching materials having compositions of $Ge_5Se_5$ of FIG. 4B and $Ge_6Se_4$ of FIG. 4C. In other words, when the atomic percentage of Ge is equal to or greater than that of Se, an on-off characteristic at a certain voltage has not been observed based on the third cycle.

It has been identified via the DC voltage sweep that a significant element of the selection device is selenium (Se) in the binary chalcogenide switching material consisting of Ge and Se. Accordingly, it has been identified that, when the atomic percentage of Ge content is less than that of Se content, the binary chalcogenide switching material may be used as the selection device.

However, at least one of the properties of the selection device layer 143, for example, thermal stability in which the threshold voltage $V_{th}$, off-state leakage current ($I_{off}$), and durability may not be satisfied only by the binary chalcogenide switching material consisting of Ge and Se. Thus, performance improvement in the selection device may be dependent on adding other materials.

FIGS. 5A to 5D are graphs illustrating voltage-current curves according to atomic percentages of Ge, Se, and Sb in the selection device layer.

As shown in FIGS. 5A to 5D, for ternary chalcogenide switching materials consisting of Ge, Se, and Sb, graphs illustrate results of applying the DC voltage sweep to chalcogenide switching materials having different compositions from one another according to changes in atomic percentages. A method of performing the DC voltage sweep is the same as the above-described method and a detailed description will be omitted here.

In addition, the ternary chalcogenide switching material consisting of Ge, Se, and Sb may be formed and the atomic percentages may be analyzed by actually same methods as the above-described methods, and thus, a detailed description will be omitted.

Figure 5A:
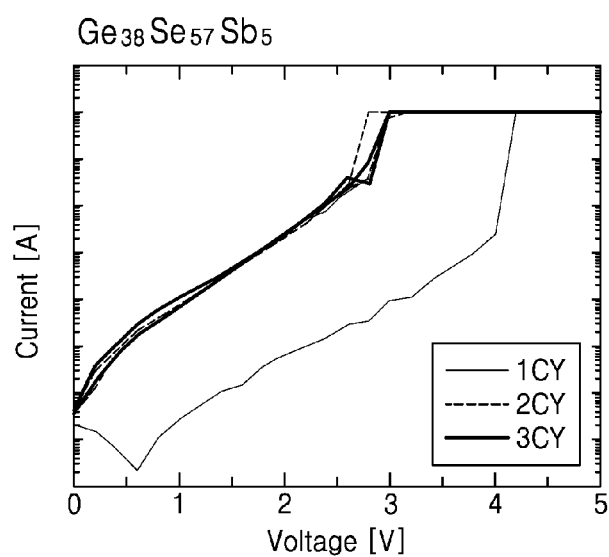
FIG. 5A is a graph illustrating voltage-current curves according to atomic percentages of Ge, Se, and antimony (Sb) in the selection device layer.
Figure 5B:
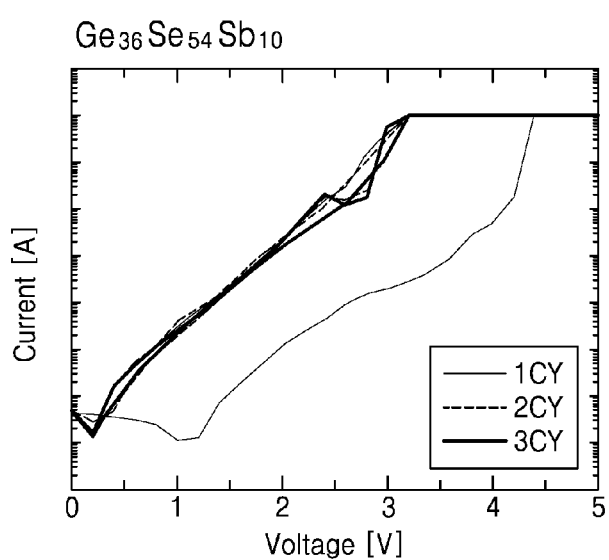
FIG. 5B is a graph illustrating voltage-current curves according to atomic percentages of Ge, Se, and Sb in the selection device layer.
Figure 5C:
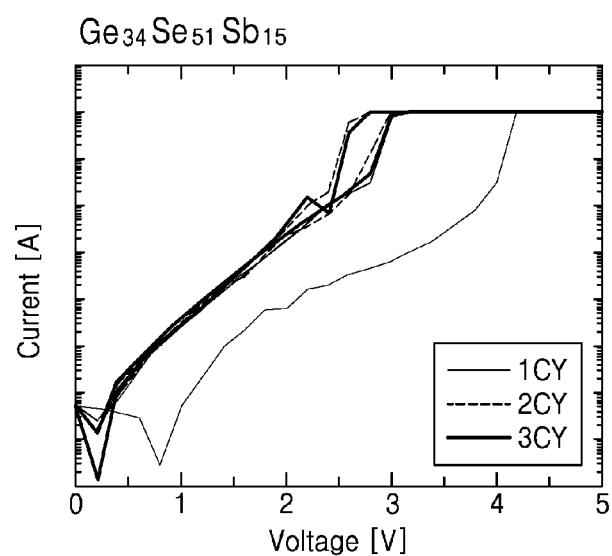
FIG. 5C is a graph illustrating voltage-current curves according to atomic percentages of Ge, Se, and Sb in the selection device layer.
Figure 5D:
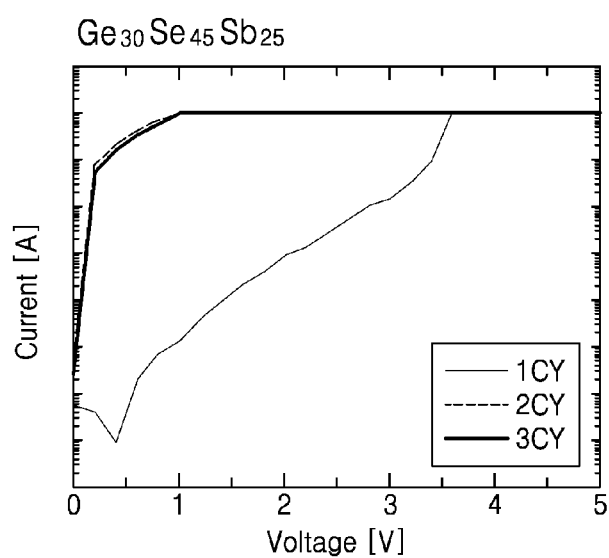
FIG. 5D is a graph illustrating voltage-current curves according to atomic percentages of Ge, Se, and Sb in the selection device layer.

In FIGS. 5A to 5D, graphs illustrate measurements of voltage-current characteristics by varying atomic percentages of Ge, Se, and Sb. FIG. 5A is a graph illustrating voltage-current curves of the chalcogenide switching material having a composition of $Ge_{38}Se_{57}Sb_5$, FIG. 5B is a graph illustrating voltage-current curves of the chalcogenide switching material having a composition of $Ge_{36}Se_{54}Sb_{10}$, FIG. 5C is a graph illustrating voltage-current curves of the chalcogenide switching material having a composition of $Ge_{34}Se_{51}Sb_{15}$, and FIG. 5D is a graph illustrating voltage-current curves of the chalcogenide switching material having a composition of $Ge_{30}Se_{45}Sb_{25}$.

Accordingly, operations of the selection device have been identified by increasing an additive amount of Sb to the chalcogenide switching material and having the atomic percentage of Ge content smaller than that of Se so that the preferred switching characteristic of the selection device may be identified from among the differing compositions of Ge—Se—Sb.

The switching characteristics of the selection device have been observed for the differing chalcogenide switching materials having compositions of $Ge_{38}Se_{57}Sb_5$ of FIG. 5A, $Ge_{36}Se_{54}Sb_{10}$ of FIG. 5B, and $Ge_{34}Se_{51}Sb_{15}$ of FIG. 5C. Since an important element for a characteristic of the selection device is antimony (Sb) when the atomic percentage of Ge content is less than that of Se content, it has been identified that, when the Se content is less than a certain amount, the chalcogenide switching material may be used as the selection device. In the case of the chalcogenide switching material having compositions of $Ge_{38}Se_{57}Sb_5$ of FIG. 5A, $Ge_{36}Se_{54}Sb_{10}$ of FIG. 5B, and $Ge_{34}Se_{51}Sb_{15}$ of FIG. 5C, the threshold voltage $V_{th}$ may be approximately about 2.4 V to about 2.8 V.

In contrast, the switching characteristic of the selection device has not been observed in voltage-current curves of chalcogenide switching materials having the composition of $Ge_{30}Se_{45}Sb_{25}$ of FIG. 5D. In other words, the preferred on-off characteristic at a certain voltage has not been observed based on the third cycle.

The ternary chalcogenide switching materials consisting of Ge, Se, and Sb according to an exemplary embodiment have been identified to show varying switching characteristics according to the atomic percentages of Ge, Se, and Sb. In other words, when the atomic percentage of Sb is greater than about 15%, the preferred switching characteristic of the selection device has not been observed.

In conclusion, the ternary chalcogenide switching material consisting of Ge, Se, and Sb according to an exemplary embodiment may include $(Ge_xSe_{1-x})_ySb_{1-y}$, and may be used as the chalcogenide switching material utilized in the selection device layer (refer to 143 in FIG. 3), when a composition is satisfied such that x is equal to or greater than about 0.2 and less than about 0.5, and y is about 0.85 to about 0.95.

The ternary chalcogenide switching material consisting of Ge, Se, and Sb according to an exemplary embodiments may not include arsenic (As), which is a toxic material. Thus, both productivity and quality may be environmentally friendly and economically enhanced in manufacturing the variable resistance memory device and in subsequent processes.

In addition, it may be necessary to increase the crystallization temperature and durability of the chalcogenide switching material and reduce the off-state leakage current ($I_{off}$) so that the selection device layer 143 using the chalcogenide switching material may be used for a three-dimensional (3D) cross-point stack structure as a replacement for a diode. To meet the above-described requirements, light elements may be doped into the chalcogenide switching material. In the present example embodiment, when C and/or N is doped into the chalcogenide switching material, carrier hopping sites included in the chalcogenide switching material may be reduced. Thus, resistivity of the selection device layer 143 including the chalcogenide switching material into which C and/or N is doped may increase, and the off-state leakage current ($I_{off}$) may be reduced. In addition, density of the selection device layer 143 may increase, and migration of electrons due to an electric field may be inhibited to improve durability of the selection device layer 143.

Furthermore, when C and/or N is doped into the chalcogenide switching material, generation and growth of nuclei in the chalcogenide switching material may be inhibited to increase the crystallization temperature of the chalcogenide switching material. Thus, a variable resistance memory device having the 3D cross-point stack structure may be manufactured by intactly using a typical process of manufacturing memory devices. As a result, manufacturing costs may be reduced.

In the present exemplary embodiment, the selection device layer 143 may include C and/or N in a content less than the Sb content based on atomic percentage. The reason is because the switching characteristics of the selection device layer 143 may be reduced when doping density of C and/or N increases.

Figure 6A:
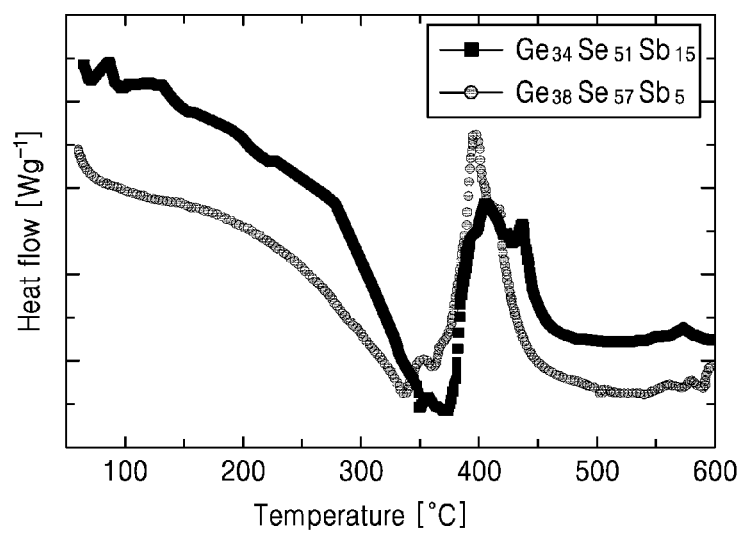
FIG. 6A is a graph illustrating a physical property of a selection device layer of a variable resistance memory device according to an exemplary embodiment.
Figure 6B:
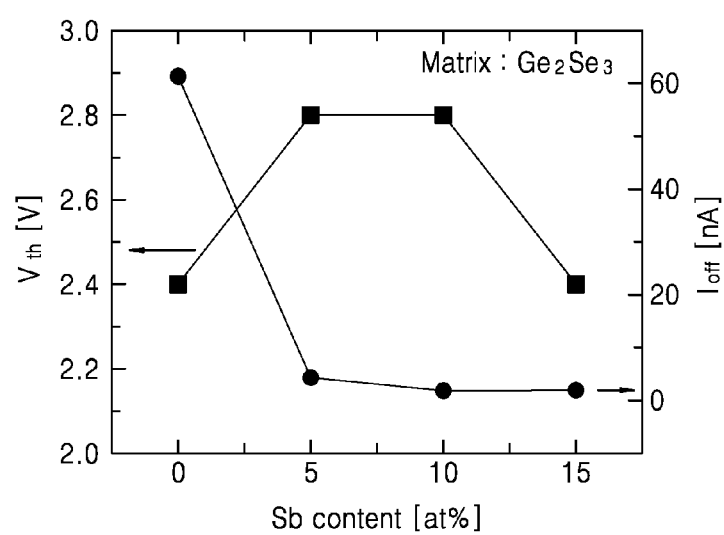
FIG. 6B is a graph illustrating a physical property of a selection device layer of a variable resistance memory device according to an exemplary embodiment.

FIGS. 6A and 6B are graphs illustrating physical properties of a selection device layer of a variable resistance memory device according to an exemplary embodiment.

As shown in FIG. 6A, the graph illustrates heat flow, measured via a differential scanning calorimetry (DSC), of respective chalcogenide switching materials having compositions of $Ge_{38}Se_{57}Sb_5$ and $Ge_{34}Se_{51}Sb_{15}$. In the graph, each peak denotes the crystallization temperature of corresponding chalcogenide switching material.

The crystallization temperature of chalcogenide switching materials having compositions of $Ge_{38}Se_{57}Sb_5$ and $Ge_{34}Se_{51}Sb_{15}$ may be about 350° C. to about 450° C. Peaks of the crystallization temperature been identified at about 380° C. as a result of measurement of the heat flow of chalcogenide switching materials having two compositions. A big difference in the crystallization temperature may not exist in chalcogenide switching materials having the same or similar compositions.

As shown in FIG. 6B, the graph illustrates changes in the threshold voltage ($V_{th}$) and the off-state leakage current ($I_{off}$) according to the Sb content, in the chalcogenide switching material of the selection device layer (refer to 143 in FIG. 3) according to an exemplary embodiment.

Firstly, a change in the $V_{th}$ will be described. The change in the $V_{th}$ may be generated by a change in the Sb content. When the atomic percentage of Sb in the chalcogenide switching material is about 5% to about 15%, the $V_{th}$ may change in a range of about 2 V to about 3 V. As a result, the $V_{th}$ may be controlled to have a value in the range of about 2 V to about 3 V depending on the Sb content. In addition, the $V_{th}$ may be affected by variables such as a thickness of the selection device layer 143.

Next, a change in the $I_{off}$ will be described. The change in the $I_{off}$ may be generated by the change in the Sb content. When the atomic percentage of Sb in the chalcogenide switching material is about 5% to about 15%, the $I_{off}$ may be reduced by about 3% to about 6% in comparison with the case when the chalcogenide switching material does not include Sb. Thus, the ternary chalcogenide switching material consisting of Ge, Se, and Sb, in comparison with the binary chalcogenide switching material consisting of Ge and Se, may exhibit the characteristic of a reduced portion of the $I_{off}$.

Hence, when a certain amount of C and/or N is doped as described above, the $I_{off}$ may be more significantly reduced while the $V_{th}$ may be conformally maintained.

In addition, even though not shown, in the chalcogenide switching material of the selection device layer 143 according to an exemplary embodiment, a switching characteristic has been identified for a pulse having a rise and fall time of 10 ns and a width of 40 ns, and a switching operation up to $10^8$ cycles has been identified by using a pulse having the rise and fall time of 10 ns and the width of 100 ns. In other words, the ternary chalcogenide switching material having a composition of Ge, Se, and Sb according to an exemplary embodiment may cause no endurance problem as the selection device.

In conclusion, the chalcogenide switching material of the selection device layer 143 according to an exemplary embodiment has been identified to satisfy important properties needed as a selection device such as thermal stability, the threshold voltage ($V_{th}$), the off-state leakage current ($I_{off}$), and endurance.

FIGS. 7 to 10 are cross-sectional views of variable resistance memory devices according to exemplary embodiments, which correspond to the cross-sectional view of FIG. 3.

Figure 7:
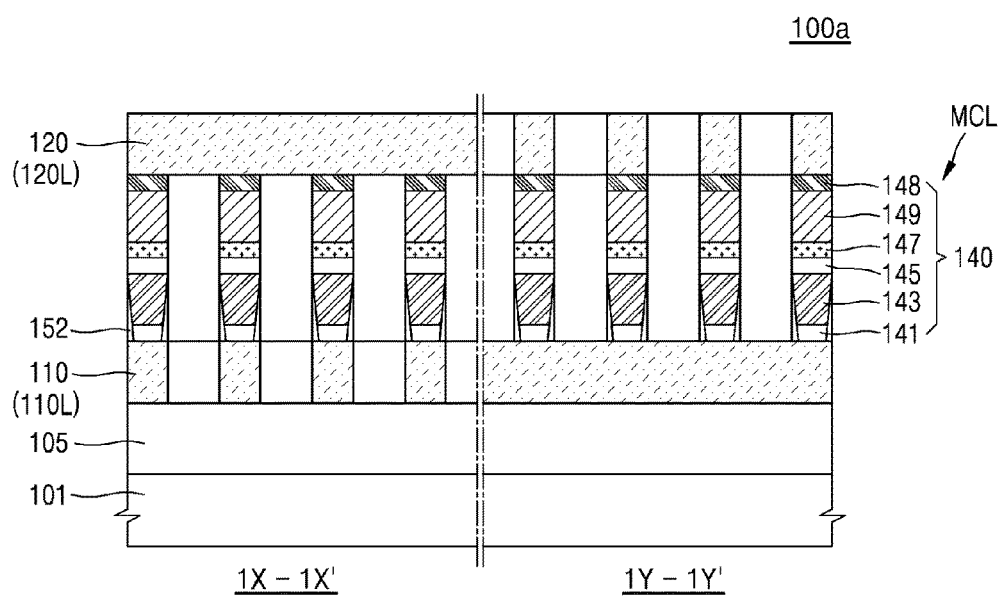
FIG. 7 is a cross-sectional view of a variable resistance memory device according to an exemplary embodiment, which corresponds to the cross-sectional view of FIG. 3.

FIG. 7 is a cross-sectional view of a variable resistance memory device 100a according to an exemplary embodiment. The same descriptions as in FIGS. 2 and 3 will be simplified or omitted.

As shown in FIG. 7, the variable resistance memory device 100a according to the present exemplary embodiment may differ from the variable resistance memory device 100 of FIG. 3 in that a lower electrode layer 141 and a selection device layer 143 have damascene structures. Specifically, in the variable resistance memory device 100a according to the present example embodiment, the lower electrode layer 141 and the selection device layer 143 may be formed by using the damascene process, while a middle electrode layer 145, a heating electrode layer 147, a variable resistance layer 149, and an upper electrode layer 148 may be formed by using the etching process. Thus, each of the lower electrode layer 141 and the selection device layer 143 may have a smaller or tapered width downwardly.

In the variable resistance memory device 100a according to the present exemplary embodiment, lower spacers 152 may be formed on side surfaces of the lower electrode layer 141 and the selection device layer 143. In the variable resistance memory device 100a according to the present exemplary embodiment, when the lower electrode layer 141 and the selection device layer 143 are formed by using the damascene process, the lower spacers 152 may be previously formed on a sidewall of a trench, and the lower electrode layer 141 and the selection device layer 143 may be formed. Thus, the variable resistance memory device 100a according to the present exemplary embodiment may include the lower spacers 152, which may be formed on the sidewalls of the lower electrode layer 141 and the selection device layer 143. Naturally, the lower spacers 152 may be omitted.

In the present exemplary embodiment, the selection device layer 143 may include the chalcogenide switching material consisting of Ge, Se, and Sb.

Figure 8:
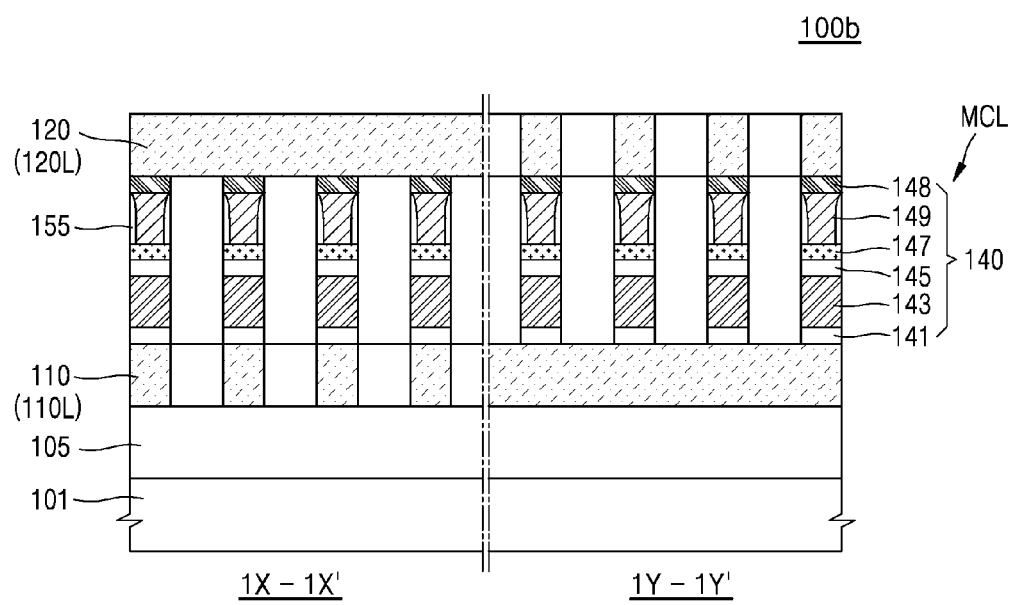
FIG. 8 is a cross-sectional view of a variable resistance memory device according to an exemplary embodiment, which corresponds to the cross-sectional view of FIG. 3.

FIG. 8 is a cross-sectional view of a variable resistance memory device 100b according to an exemplary embodiment. The same descriptions as in FIGS. 2 and 3 will be simplified or omitted.

As shown in FIG. 8, the variable resistance memory device 100b according to the present exemplary embodiment may differ from the variable resistance memory device 100 of FIG. 3 in that a variable resistance layer 149 has the damascene structure. In detail, in the variable resistance memory device 100b according to the present exemplary embodiment, a lower electrode layer 141, a selection device layer 143, a middle electrode layer 145, a heating electrode layer 147, and an upper electrode layer 148 may be formed by using the etching process, while a variable resistance layer 149 may be formed by using the damascene process. In addition, in the variable resistance memory device 100b according to the present exemplary embodiment, upper spacers 155 may be formed on side surfaces of the variable resistance layer 149. The upper spacers 155 may be formed by using the same method as the above-described method of forming the lower spacers 152 of the variable resistance memory device 100a of FIG. 7. For example, the formation of the upper spacers 155 may include forming the trench in an insulating layer (not shown), forming the upper spacers 155 on inner sidewalls of the trench, and filling the remaining space of the trench with a material included in the variable resistance layer 149. Naturally, the upper spacers 155 may be omitted.

In the present example embodiment, the selection device layer 143 may include the chalcogenide switching material consisting of Ge, Se, and Sb.

Figure 9:
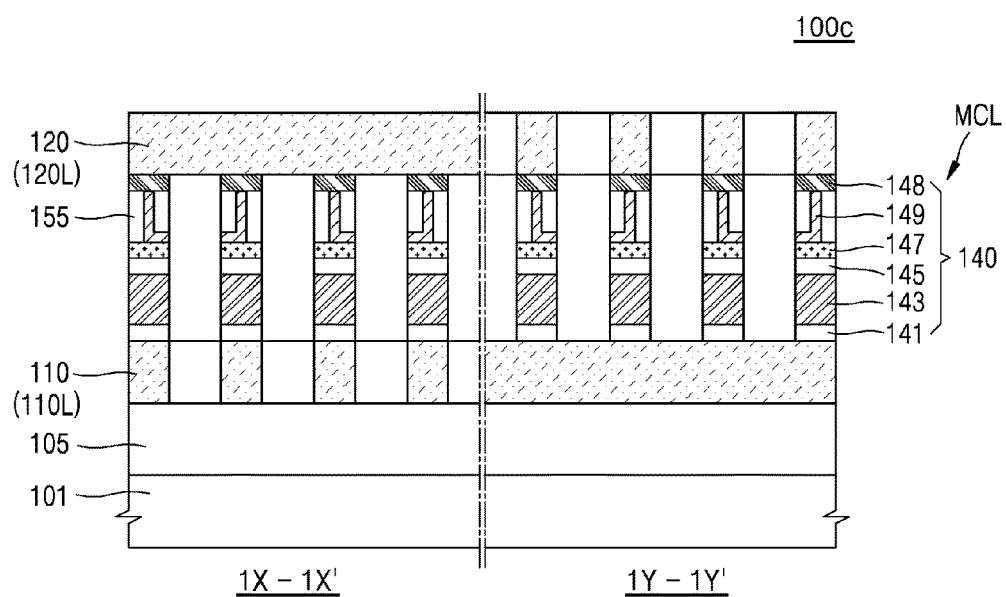
FIG. 9 is a cross-sectional view of a variable resistance memory device according to an exemplary embodiment, which corresponds to the cross-sectional view of FIG. 3.

FIG. 9 is a cross-sectional view of a variable resistance memory device 100c according to an example embodiment. The same descriptions as in FIGS. 2 and 3 will be simplified or omitted.

As shown in FIG. 9, the variable resistance memory device 100c according to the present exemplary embodiment may differ from the variable resistance memory device 100b of FIG. 8 in that a variable resistance layer 149 has a damascene structure in an 'L'-shaped structure. Specifically, in the variable resistance memory device 100c according to the present exemplary embodiment, a lower electrode layer 141, a selection device layer 143, a middle electrode layer 145, a heating electrode layer 147, and an upper electrode layer 148 may be formed by using the etching process, while the variable resistance layer 149 may be formed by using the damascene process.

In the variable resistance memory device 100c according to the present exemplary embodiment, upper spacers 155 may be formed on side surfaces of the variable resistance layer 149. However, since the variable resistance layer 149 has the 'L'-shaped structure, the upper spacers 155 may have asymmetric structures. A method of forming the variable resistance layer 149 having the 'L'-shaped structure by using the damascene process will now be briefly described. To begin with, an insulating layer may be formed on the heating electrode layer 147, and the trench may be formed in the insulating layer. The trench may be formed to a great width and overlap memory cells 140 adjacent to the trench. Next, a first material layer forming the variable resistance layer 149 may be formed to a small thickness in the trench and on the insulating layer. Thereafter, a second material layer forming the upper spacers 155 may be formed on the first material layer. The resultant structure may be planarized by using a chemical mechanical polishing (CMP) process to expose a top surface of the insulating layer. After a CMP process, a mask pattern may be formed in alignment with the memory cells 140, and the first and second material layers may be etched by using the mask pattern. As a result, the variable resistance layer 149 having an 'L'-shaped structure and the upper spacers 155 may be formed.

In the present exemplary embodiment, the selection device layer 143 may include the chalcogenide switching material consisting of Ge, Se, and Sb.

Figure 10:
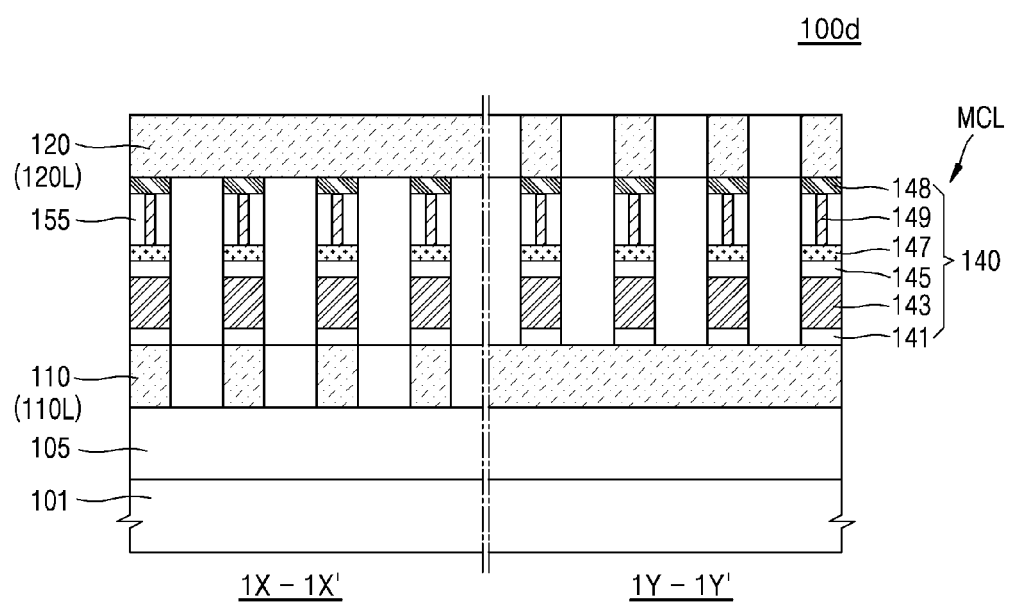
FIG. 10 is a cross-sectional view of a variable resistance memory device according to an exemplary embodiment, which corresponds to the cross-sectional view of FIG. 3.

FIG. 10 is a cross-sectional view of a variable resistance memory device 100d according to an exemplary embodiment. The same descriptions as in FIGS. 2 and 3 will be simplified or omitted.

As shown in FIG. 10, the variable resistance memory device 100d according to the present exemplary embodiment may differ from the variable resistance memory device 100c of FIG. 9 in that a variable resistance layer 149 has a dash structure. The variable resistance layer 149 having the dash structure may be formed in a similar method to a method of forming an 'L'-shaped structure. For example, after a first material layer forming the variable resistance layer 149 is formed to a small thickness in the trench and on the insulating layer, the first material layer may remain only on a sidewall of the trench by using an anisotropic etching process. Thereafter, a second material layer may be formed to cover the remaining first material layer. Next, the second material layer may be planarized by using the CMP process to expose a top surface of the insulating layer. Thereafter, a mask pattern may be formed in alignment with the memory cells 140, and the second material layer may be etched by using the mask pattern, thereby forming the variable resistance layer 149 having a dash structure and upper spacers 155.

In the present exemplary embodiment, the selection device layer 143 may include the chalcogenide switching material consisting of Ge, Se, and Sb.

Figure 11:
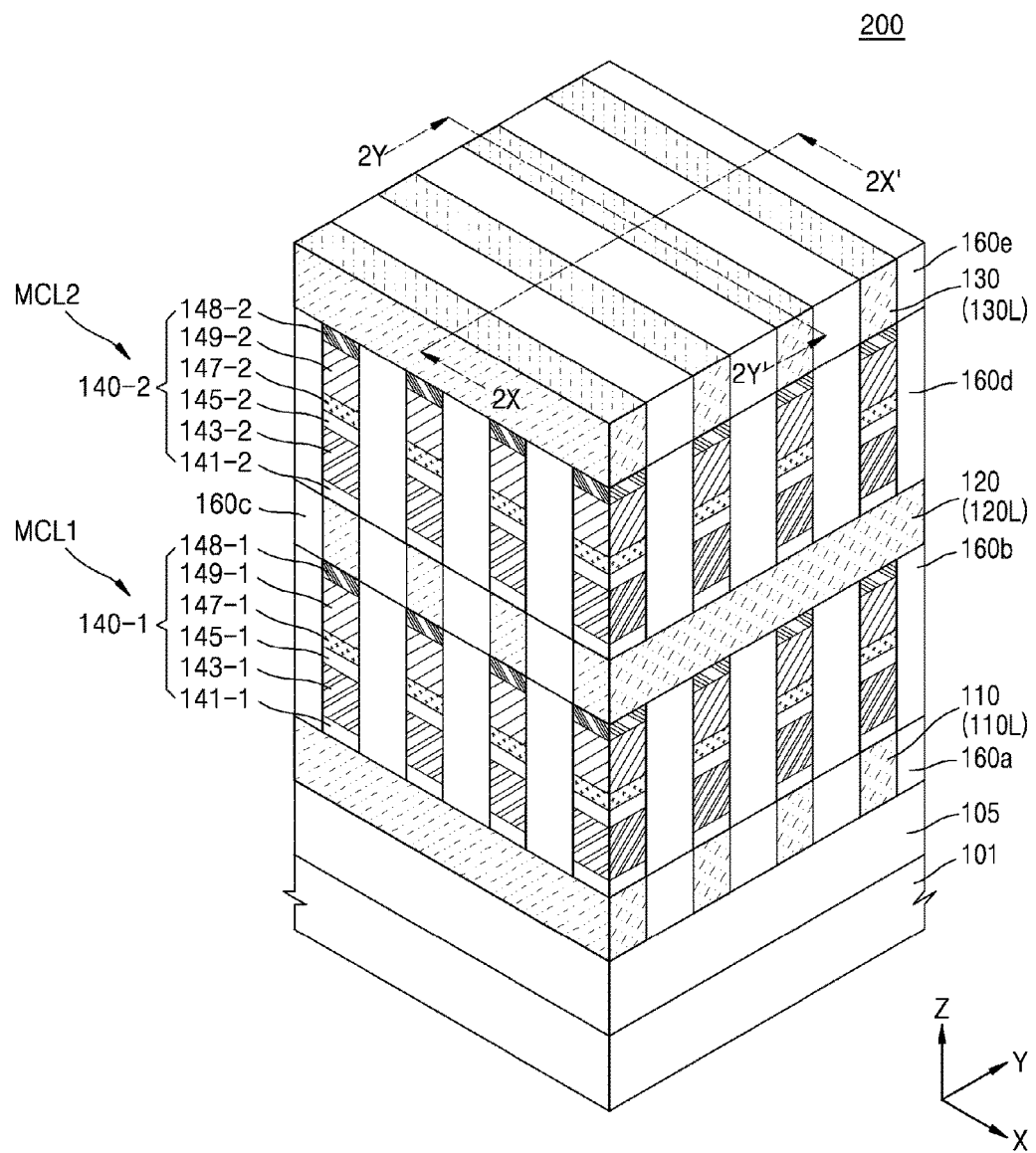
FIG. 11 is a perspective view of a variable resistance memory device according to an exemplary embodiment.
Figure 12:
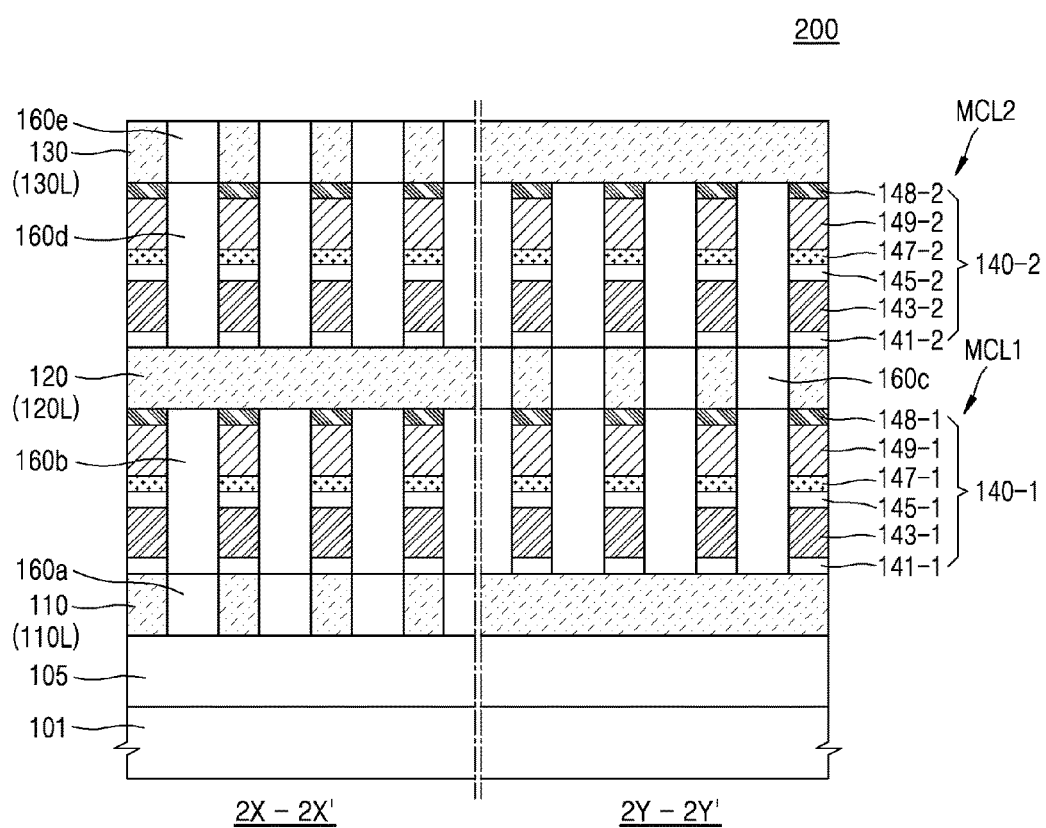
FIG. 12 is a cross-sectional view taken along lines 2X-2X' and 2Y-2Y' of FIG. 11.

FIG. 11 is a perspective view of a variable resistance memory device 200 according to an exemplary embodiment, and FIG. 12 is a cross-sectional view taken along lines 2X-2X' and 2Y-2Y' of FIG. 11. The same descriptions as in FIGS. 2 and 3 will be simplified or omitted.

As shown in FIGS. 11 and 12, the variable resistance memory device 200 may include a first electrode line layer 110L, a second electrode line layer 120L, a third electrode line layer 130L, a first memory cell layer MCL1, and a second memory cell layer MCL2, which may be located on a substrate 101.

As shown, the first interlayer insulating layer 105 may be located on the substrate 101. The first electrode line layer 110L may include a plurality of first electrode lines 110, which may extend parallel to one another in a first direction (X direction). The second electrode line layer 120L may include a plurality of second electrode lines 120, which may extend parallel to one another in a second direction (Y direction) perpendicular to the first direction. In addition, the third electrode line layer 130L may include a plurality of third electrode lines 130, which may extend parallel to one another in the first direction (X direction). Meanwhile, the third electrode lines 130 may be different from the first electrode lines 110 in terms of positions in a third direction (Z direction) but the same as the first electrode lines 110 in terms of an extension direction or an arrangement structure. Accordingly, the third electrode lines 130 may be referred to as first electrode lines of the third electrode line layer 130L.

Operations of the variable resistance memory device 200 will now be described. The first electrode lines 110 and the third electrode lines 130 may correspond to word lines, and the second electrode lines 120 may correspond to bit lines. Conversely, the first electrode lines 110 and the third electrode lines 130 may correspond to bit lines, and the second electrode lines 120 may correspond to word lines. When the first electrode lines 110 and the third electrode lines 130 correspond to the word line, the first electrode lines 110 may correspond to lower word lines, and the third electrode lines 130 may correspond to upper word lines. In addition, since the second electrode lines 120 are shared between the lower word lines and the upper word lines, the second electrode lines 120 may correspond to common bit lines.

Each of the first electrode lines 110, the second electrode lines 120, and the third electrode lines 130 may include a metal, a conductive metal nitride, a conductive metal oxide, or a combination thereof. In addition, each of the first electrode lines 110, the second electrode lines 120, and the third electrode lines 130 may include a metal layer and a conductive barrier layer covering at least a portion of the metal layer.

The first memory cell layer MCL1 may include a plurality of first memory cells 140-1, which are spaced apart from one another in the first direction and the second direction. The second memory cell layer MCL2 may include a plurality of second memory cells 140-2, which may be spaced apart from one another in the first direction and the second direction. As shown, the first electrode lines 110 may intersect the second electrode lines 120, and the second electrode lines 120 may intersect the third electrode lines 130. The first memory cells 140-1 may be located between the first electrode line layer 110L and the second electrode line layer 120L at intersections between the first electrode lines 110 and the second electrode lines 120. The second memory cells 140-2 may be located between the second electrode line layer 120L and the third electrode line layer 130L at intersections between the second electrode lines 120 and the third electrode lines 130.

Each of the first memory cells 140-1 may include a lower electrode layer 141-1, a selection device layer 143-1, a middle electrode layer 145-1, a heating electrode layer 147-1, a variable resistance layer 149-1, and an upper electrode layer 148-1. In addition, each of the second memory cells 140-2 may include a lower electrode layer 141-2, a selection device layer 143-2, a middle electrode layer 145-2, a heating electrode layer 147-2, a variable resistance layer 149-2, and an upper electrode layer 148-2. The first memory cells 140-1 may have substantially the same structure as the second memory cells 140-2.

A first insulating layer 160a may be located between the first electrode lines 110, and the second insulating layer 160b may be located between the first memory cells 140-1 of the first memory cell layer MCL1. In addition, a third insulating layer 160c may be located between the second electrode lines 120, a fourth insulating layer 160d may be located between the second memory cells 140-2 of the second memory cell layer MCL2, and a fifth insulating layer 160e may be located between the third electrode lines 130. The first to fifth insulating layers 160a to 160e may include the same material or at least one of the first to fifth insulating layers 160a to 160e may include a different material. The first to fifth insulating layers 160a to 160e may include a dielectric material, for example, an oxide, or a nitride, and function to electrically isolate devices included in each layer from one another. Meanwhile, air gaps (not shown) may be formed instead of at least one of the second insulating layer 160b and the fourth insulating layer 160d. When the air gaps are formed, an insulating liner (not shown) having a predetermined thickness may be formed between the air gaps and the first memory cells 140-1 and/or the air gaps and the second memory cells 140-2.

The variable resistance memory device 200 according to the present example embodiment may basically have a structure formed by repetitively stacking variable resistance memory devices 100 having structures shown in FIGS. 2 and 3. However, a structure of the variable resistance memory device 200 according to the present exemplary embodiment is not limited thereto. For example, the variable resistance memory device 200 according to the present example exemplary embodiment may have a structure in which the variable resistance memory devices 100a to 100d having various structures as shown in FIGS. 7 to 10 are stacked.

In the present exemplary embodiment, each of the selection device layers 143-1 and 143-2 of the first memory cells 140-1 and the second memory cells 140-2 may include the chalcogenide switching material consisting of Ge, Se, and Sb.

Figure 13:
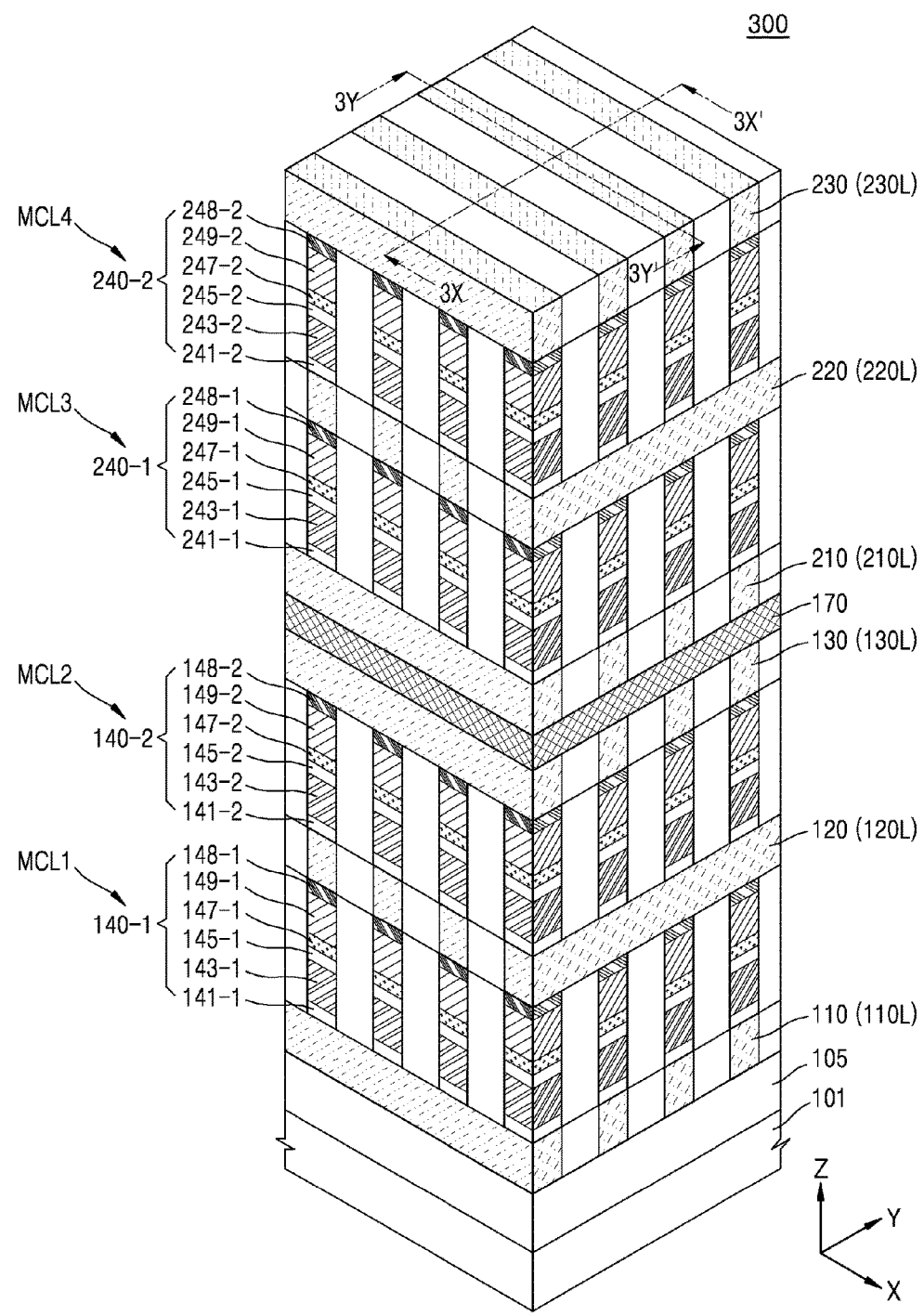
FIG. 13 is a perspective view of a variable resistance memory device according to an exemplary embodiment.
Figure 14:
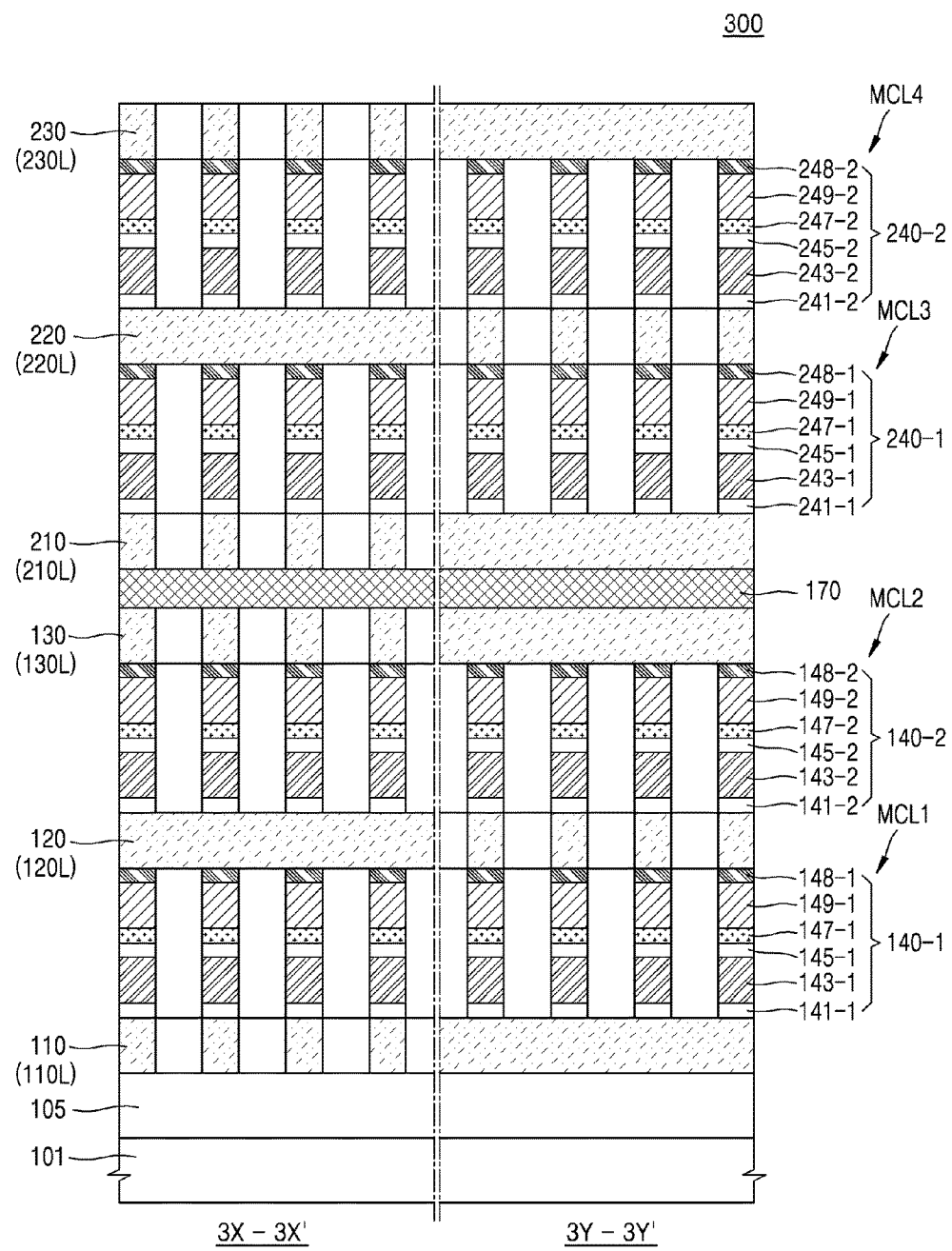
FIG. 14 is a cross-sectional view taken along lines 3X-3X' and 3Y-3Y' of FIG. 13.

FIG. 13 is a perspective view of a variable resistance memory device 300 according to an example embodiment, and FIG. 14 is a cross-sectional view taken along lines 3X-3X' and 3Y-3Y' of FIG. 13. The same descriptions as in FIGS. 2, 3, 11, and 12 will be simplified or omitted.

As shown in FIGS. 13 and 14, the variable resistance memory device 300 according to the present example embodiment may have a quadruple structure including four stacked memory cell layers MCL1, MCL2, MCL3, and MCL4. Specifically, a first memory cell layer MCL1 may be located between a first electrode line layer 110L and a second electrode line layer 120L, and a second memory cell layer MCL2 may be located between the second electrode line layer 120L and a third electrode line layer 130L. A second interlayer insulating layer 170 may be formed on the third electrode line layer 130L, and a first upper electrode line layer 210L, a second upper electrode line layer 220L, and a third upper electrode line layer 230L may be located on the second interlayer insulating layer 170. The first upper electrode line layer 210L may include first upper electrode lines 210 having the same structures as first electrode lines 110, and the second upper electrode line layer 220L may include second upper electrode lines 220 having the same structures as second electrode lines 120. In addition, the third upper electrode line layer 230L may include third upper electrode lines 230 having the same structures as the third electrode lines 130 or the first electrode lines 110. The first upper memory cell layer MCL3 may be located between the first upper electrode line layer 210L and the second upper electrode line layer 220L, and the second upper memory cell layer MCL4 may be located between the second upper electrode line layer 220L and the third upper electrode line layer 230L.

The first to third electrode line layers 110L to 130L and the first and second memory cell layers MCL1 and MCL2 may be the same as described with reference to FIGS. 2, 3, 11, and 12. In addition, the first to third upper electrode line layers 210L to 230L and the first and second upper memory cell layers MCL3 and MCL4 may be substantially the same as the first to third electrode line layers 110L to 130L and the first and second memory cell layers MCL1 and MCL2 except that the first to third upper electrode line layers 210L to 230L and the first and second upper memory cell layers MCL3 and MCL4 are located on the second interlayer insulating layer 170 instead of the first interlayer insulating layer 105.

In the present exemplary embodiment, each of the selection device layers 143-1, 143-2, 243-1, and 243-2 included in the first memory cells 140-1, the second memory cells 140-2, the first upper memory cells 240-1, and the second upper memory cells 240-2 may include the chalcogenide switching material consisting of Ge, Se, and Sb.

The variable resistance memory device 300 according to the present exemplary embodiment may basically have a structure formed by repetitively stacking variable resistance memory devices 100 having structures shown in FIGS. 2 and 3. However, a structure of the variable resistance memory device 300 according to the present exemplary embodiment is not limited thereto. For example, the variable resistance memory device 300 according to the present exemplary embodiment may have a structure formed by stacking variable resistance memory devices 100a to 100d having various structures shown in FIGS. 7 to 10.

Figure 15:
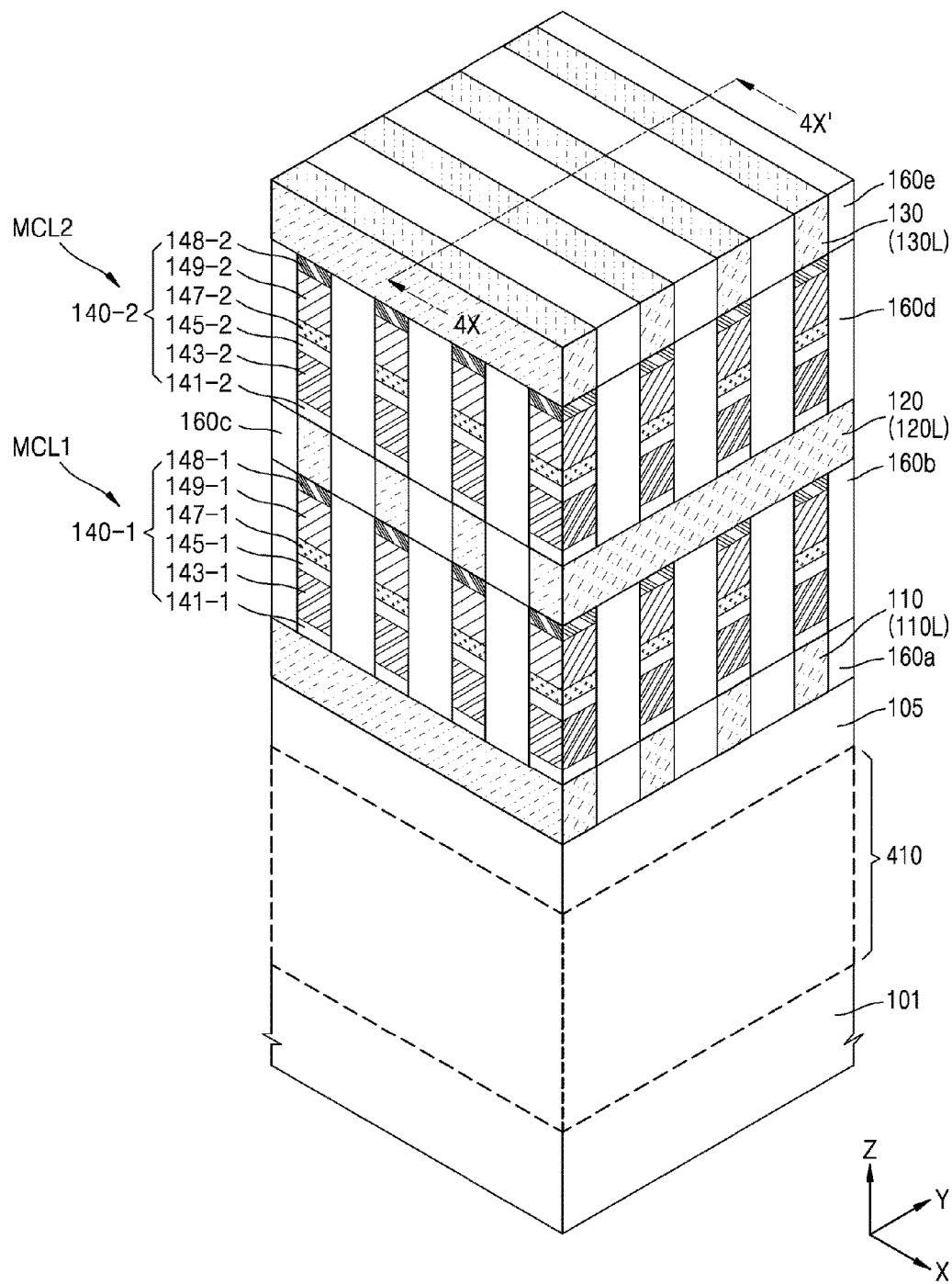
FIG. 15 is a perspective view of a variable resistance memory device according to an exemplary embodiment.
Figure 16:
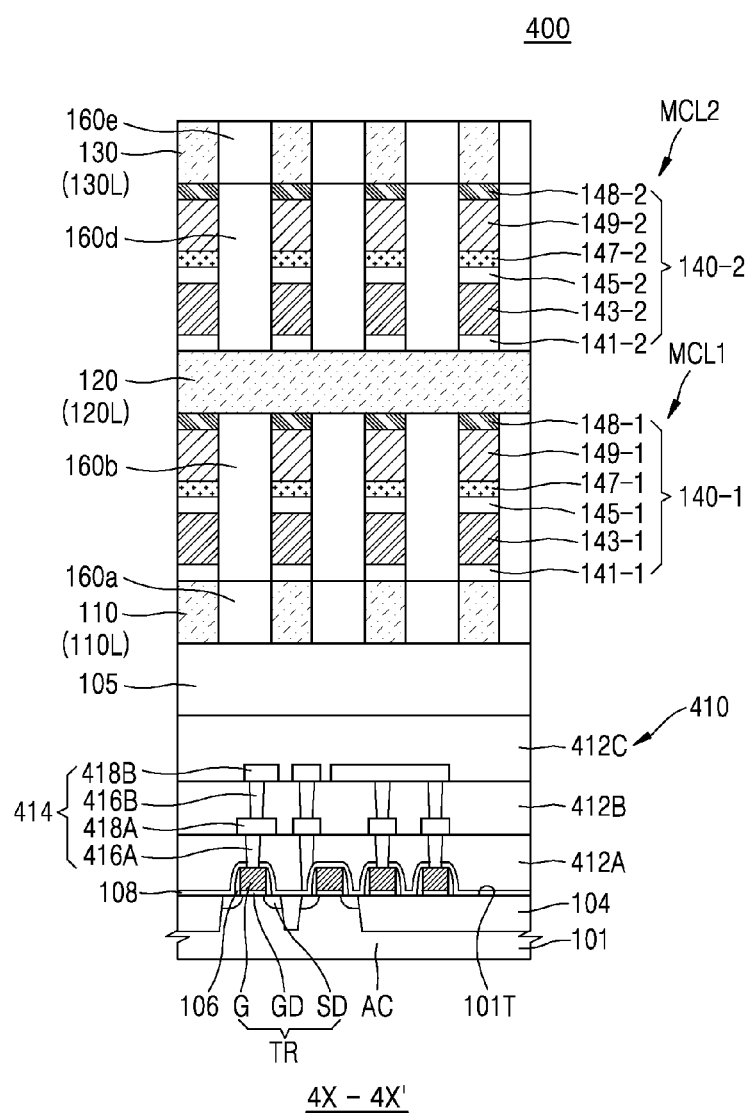
FIG. 16 is a cross-sectional view taken along lines 4X-4X' and 4Y-4Y' of FIG. 15.

FIG. 15 is a perspective view of a variable resistance memory device 400 according to an exemplary embodiment, and FIG. 16 is a cross-sectional view taken along a line 4X-4X' of FIG. 15. The same descriptions as in FIGS. 2, 3, 11, and 12 will be simplified or omitted.

As shown in FIGS. 15 and 16, the variable resistance memory device 400 may include a driver circuit region 410 formed at a first level on a substrate 101 and a first memory cell layer MCL1 and a second memory cell layer MCL2 formed at a second level on the substrate 101.

Here, a term "level" may refer to a height obtained in a vertical direction (refer to Z direction in FIGS. 15 and 16) from the substrate 101. The first level may be closer to the substrate 101 than the second level on the substrate 101.

The driver circuit region 410 may be a region in which peripheral circuits or driver circuits for driving memory cells included in the first memory cell layer MCL1 and the second memory cell layer MCL2 are located. For example, the peripheral circuits located in the driver circuit region 410 may be circuits capable of processing data input to and output from the first memory cell layer MCL1 and the second memory cell layer MCL2 at high speed. For example, the peripheral circuits may be a page buffer, a latch circuit, a cache circuit, a column decoder, a sense amplifier, a data in/out circuit, or a row decoder.

An active region AC for a driver circuit may be defined by a device isolation layer 104 in the substrate 101. A plurality of transistors TR included in the driver circuit region 410 may be formed on the active region AC of the substrate 101. Each of the plurality of transistors TR may include a gate G, a gate insulating layer GD, and source and drain regions SD. Both sidewalls of the gate G may be covered with insulating spacers 106, and an etch stop layer 108 may be formed on the gate G and the insulating spacers 106. The etch stop layer 108 may include an insulating material, such as silicon nitride or silicon oxynitride.

A plurality of interlayer insulating layers 412A, 412B, and 412C may be sequentially stacked on the etch stop layer 108. The plurality of interlayer insulating layers 412A, 412B, and 412C may include silicon oxide, silicon nitride, and silicon oxynitride.

A driver circuit region 410 may include multi-layered interconnection structures 414, which may be electrically connected to a plurality of transistors TR. The multi-layered interconnection structures 414 may be electrically insulated from one another by the plurality of interlayer insulating layers 412A, 412B, and 412C.

Each of the multi-layered interconnection structures 414 may include a first contact 416A, a first interconnection layer 418A, a second contact 416B, and a second interconnection layer 418B, which are sequentially stacked on the substrate 101 and electrically connected to one another. In some example embodiments, the first interconnection layer 418A and the second interconnection layer 418B may include a metal, a conductive metal nitride, a metal silicide, or a combination thereof. For example, the first interconnection layer 418A and the second interconnection layer 418B may include a conductive material, such as W, Mo, Ti, Co, Ta, Ni, tungsten silicide ($WSi_2$), titanium silicide ($TiSi_2$), cobalt silicide ($CoSi_2$), tantalum silicide ($TaSi_2$), and nickel silicide (NiSi).

FIG. 16 illustrates an example in which each of the multi-layered interconnection structures 414 is a double interconnection structure including the first interconnection layer 418A and the second interconnection layer 418B, but the illustrated exemplary embodiment is not limited to the example shown in FIG. 16. For example, each of the multi-layered interconnection structures 414 may include at least three layers according to a layout of the driver circuit region 410 and the arrangement of gates G.

The first interlayer insulating layer 105 may be formed on the plurality of interlayer insulating layers 412A, 412B, and 412C. The first memory cell layer MCL1 and the second memory cell layer MCL2 may be located on the first interlayer insulating layer 105.

Although not shown, an interconnection structure (not shown) may be connected between the first memory cell layer MCL1 and the second memory cell layer MCL2 and penetrate the first interlayer insulating layer 105.

In the variable resistance memory device 400 according to exemplary embodiments, the first memory cell layer MCL1 and the second memory cell layer MCL2 may be located on the driver circuit region 410 so that integration density of the variable resistance memory device 400 may further increase.

In the present exemplary embodiment, each of the selection device layers 143-1 and 143-2 of the first memory cells 140-1 and the second memory cells 140-2 may include the chalcogenide switching material consisting of Ge, Se, and Sb.

Figure 17:
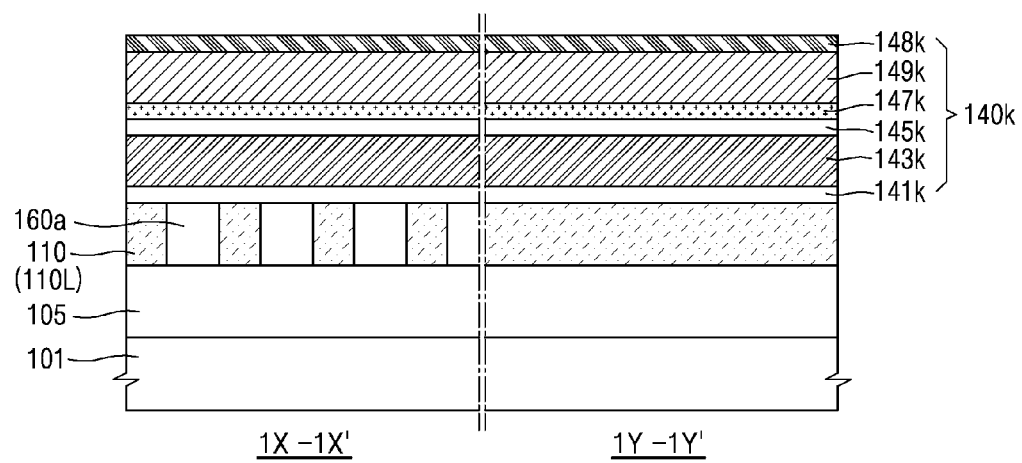
FIG. 17 is a cross-sectional view, illustrating a method of manufacturing the variable resistance memory device of FIG. 2, according to an exemplary embodiment.
Figure 18:
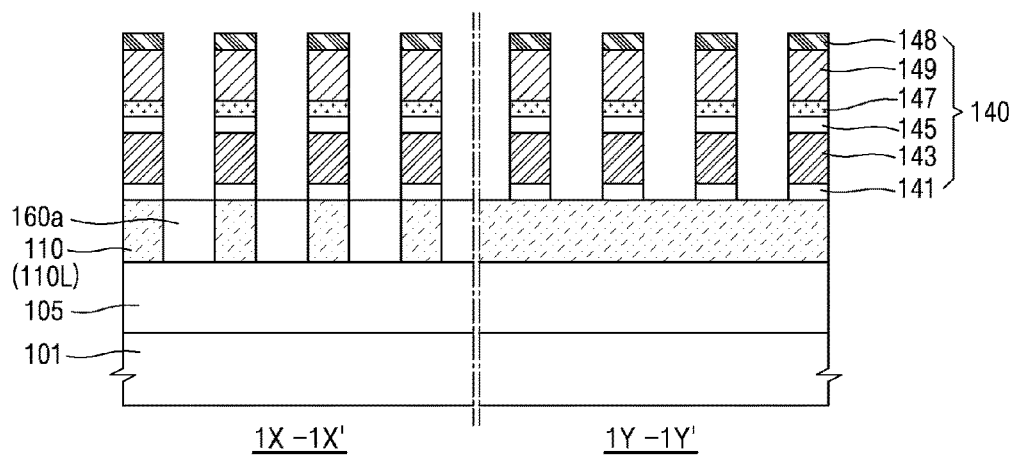
FIG. 18 is a cross-sectional view, illustrating a method of manufacturing the variable resistance memory device of FIG. 2, according to an exemplary embodiment.
Figure 19:
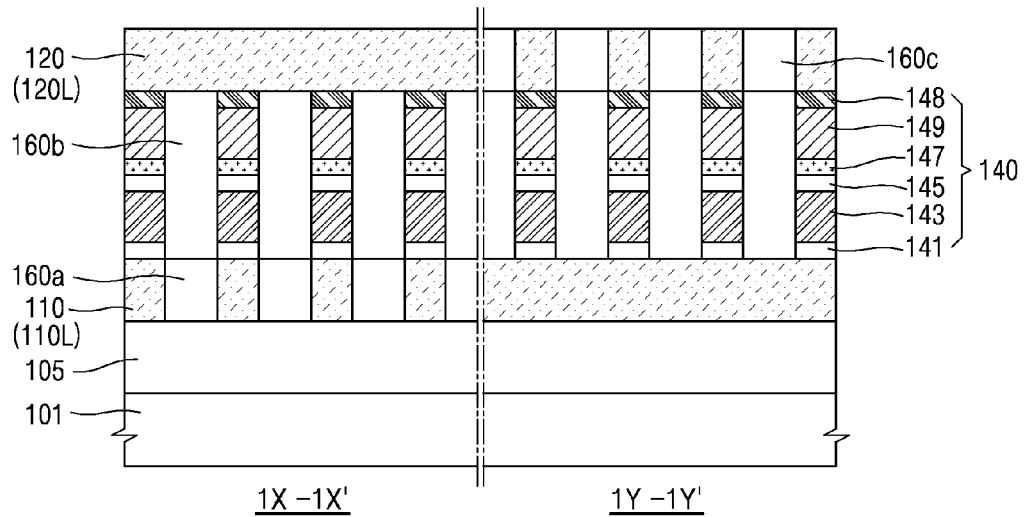
FIG. 19 is a cross-sectional view, illustrating a method of manufacturing the variable resistance memory device of FIG. 2, according to an exemplary embodiment.

FIGS. 17 to 19 are cross-sectional views, illustrating a method of manufacturing the variable resistance memory device 100 of FIG. 2, according to exemplary embodiments.

As shown in FIG. 17, the first interlayer insulating layer 105 may be firstly formed on a substrate 101. The first interlayer insulating layer 105 may include, for example, silicon oxide or silicon nitride. However, a material included in the first interlayer insulating layer 105 is not limited to the above-described materials. A first electrode line layer 110L may be formed on the first interlayer insulating layer 105. The first electrode line layer 110L may include a plurality of first electrode lines 110, which may extend in a first direction (X direction) and apart from one another. The first electrode lines 110 may be formed by using the etching process or the damascene process. A material included in the first electrode lines 110 may be the same as described with reference to FIGS. 2 and 3. A first insulating layer 160a may be located between the first electrode lines 110 and extend in the first direction.

A lower electrode material layer 141k, a selection device material layer 143k, a middle electrode material layer 145k, a heating electrode material layer 147k, a variable resistor material layer 149k, and an upper electrode material layer 148k may be sequentially stacked on the first electrode line layer 110L and the first insulating layer 160a, and form a stack structure 140k. A material or function of each material layer included in the stack structure 140k may be the same as described with reference to FIGS. 2 and 3.

The selection device material layer 143k may be formed by using a target including the chalcogenide switching material consisting of Ge, Se, and Sb via a physical vapor deposition (PVD) process. Alternatively, the selection device material layer 143k may be formed by using a source including the chalcogenide switching material consisting of Ge, Se, and Sb via a chemical vapor deposition (CVD) process or an atomic layer deposition (ALD) process.

In the present exemplary embodiment, the selection device material layer 143k may include the chalcogenide switching material consisting of Ge, Se, and Sb. A desired dopant concentration may be obtained by controlling the content of dopant included in the target or the source.

As shown in FIG. 18, after the stack structure (refer to 140k in FIG. 17) is formed, mask patterns (not shown) may be formed on the stack structure 140k and spaced apart from one another in a first direction (X direction) and a second direction (Y direction). Thereafter, the stack structure 140k may be etched by using the mask patterns to expose portions of top surfaces of the first insulating layer 160a and the first electrode lines 110, thereby forming the plurality of memory cells 140.

The memory cells 140 may be spaced apart from one another in the first direction and the second direction based on structures of the mask patterns, and electrically connected to the first electrode lines 110 located thereunder. In addition, each of the memory cells 140 may include a lower electrode layer 141, a selection device layer 143, a middle electrode layer 145, a heating electrode layer 147, a variable resistance layer 149, and an upper electrode layer 148. After the memory cells 140 are formed, the remaining mask patterns may be removed by using an ashing process and a strip process.

A method of forming the above-described memory cells 140 may be performed by using the etching process. However, the method of forming the memory cells 140 is not limited to the etching process. In an exemplary embodiment, the memory cells 140 may be formed by using the damascene process. For example, the formation of the variable resistance layers 149 of the memory cells 140 may include forming an insulating material layer and etching the insulating material layer to form the trench exposing a top surface of the heating electrode layer 147. Thereafter, the trench may be filled with a phase-change material, and the phase-change material may be planarized by using the CMP process, thereby forming the variable resistance layer 149.

As shown in FIG. 19, a second insulating layer 160*b* may be formed to fill spaces between the memory cells 140. The second insulating layer 160*b* may include an oxide or a nitride, which is the same as or different from the first insulating layer 160*a*. An insulating material layer may be formed to a sufficient thickness to completely fill the spaces between the memory cells 140, and planarized by using the CMP process until a top surface of the upper electrode layer 148 is exposed. Thus, the second insulating layer 160*b* may be formed.

Thereafter, a conductive layer for a second electrode line layer may be formed and patterned by using the etching process to form second electrode lines 120. The second electrode lines 120 may extend in the second direction (Y direction) and be spaced apart from one another. A third insulating layer 160*c* may be located between the second electrode lines 120 and extend in the second direction. A method of forming the above-described second electrode lines 120 may be performed by using the etching process. However, the method of forming the second electrode lines 120 is not limited thereto the etching process. For example, the second electrode lines 120 may be formed by using a damascene process. The formation of the second electrode lines 120 by using a damascene process may include forming an insulating material layer on the memory cells 140 and the second insulating layer 160*b*, etching the insulating material layer to form trenches extending in the second direction and exposing a top surface of the variable resistance layer 149, filling the trenches with a conductive material, and planarizing the conductive material. In some cases, the formation of the second electrode lines 120 may include forming an insulating material layer to a great thickness to fill spaces between the memory cells 140, planarizing the insulating material layer, and forming trenches in the insulating material layer. In this case, the second insulating layer 160*b* and the third insulating layer 160*c* may be formed as a one-body type by using the same material.

While the inventive concept has been particularly shown and described with reference to exemplary embodiments thereof, it will be understood that various changes in form and details may be made therein without departing from the spirit and scope of the following claims.

What is claimed is:

1. A variable resistance memory device comprising:
   a first electrode layer;
   a selection device layer on the first electrode layer, the selection device layer including a chalcogenide switching material consisting essentially of germanium (Ge), selenium (Se), and antimony (Sb), wherein a content of Ge is less than a content of Se based on an atomic weight;
   a second electrode layer on the selection device layer;
   a variable resistance layer on the second electrode layer, the variable resistance layer including a chalcogenide material; and
   a third electrode layer on the variable resistance layer.

2. The variable resistance memory device of claim 1, wherein the chalcogenide switching material comprises $(Ge_xSe_{1-x})_ySb_{1-y}$, wherein x is equal to or greater than about 0.2 and less than about 0.5, and y is about 0.85 to about 0.95.

3. The variable resistance memory device of claim 1, wherein the selection device layer does not comprise arsenic (As).

4. The variable resistance memory device of claim 1, wherein the chalcogenide switching material comprises at least one of a carbon (C) dopant and a nitrogen (N) dopant.

5. The variable resistance memory device of claim 4, wherein a doping content of the at least one of C dopant and N dopant in the selection device layer is less than a content of Sb based on the atomic weight.

6. The variable resistance memory device of claim 1, wherein the variable resistance layer further includes a super lattice structure which includes at least one selected out of germanium-antimony-tellurium (GeSbTe), indium-antimony-tellurium (InSbTe), and bismuth-antimony-telluride (BiSbTe), or has germanium-telluride (GeTe) and antimony-telluride (SbTe) being alternately laminated on each other, and elements of the variable resistance layer are different from elements of the selection device layer.

7. The variable resistance memory device of claim 1, wherein the variable resistance layer has one of a pillar structure, a conic structure, an L-shaped structure, and a dash structure.

8. The variable resistance memory device of claim 1, wherein each of the first electrode layer, the second electrode layer, and the third electrode layer comprises one or more of C, titanium nitride (TiN), titanium silicon nitride (TiSiN), titanium carbon nitride (TiCN), titanium carbon silicon nitride (TiCSiN), titanium aluminum nitride (TiAlN), tantalum (Ta), tantalum nitride (TaN), tungsten (W), and tungsten nitride (WN).

9. A variable resistance memory device comprising:
   a first electrode layer;
   a selection device on the first electrode layer, the selection device including a chalcogenide switching material including Ge, Se, and Sb, without As, wherein a content of the Ge is less than a content of the Se based on an atomic weight;
   a second electrode layer on the selection device;
   a variable resistance layer on the second electrode layer, the variable resistance layer including a chalcogenide material; and
   a third electrode layer on the variable resistance layer.

10. A variable resistance memory device comprising:
    a first electrode line layer, the first electrode line layer including a plurality of first electrode lines spaced apart from one another and extending in a first direction;
    a second electrode line layer above the first electrode line layer, the second electrode line layer including a plurality of second electrode lines spaced apart from one another and extending in a second direction different from the first direction;
    a third electrode line layer above the second electrode line layer, the third electrode line layer including a plurality of third electrode lines extending in the first direction;
    a first memory cell layer between the first electrode line layer and the second electrode line layer, the first memory cell layer including a plurality of first memory cells located at intersections between the first electrode lines and the second electrode lines; and
    a second memory cell layer between the second electrode line layer and the third electrode line layer, the second memory cell layer including a plurality of second memory cells located at intersections between the second electrode lines and the third electrode lines,
    wherein each of the plurality of first memory cells and the plurality of second memory cells comprises a selection device layer, an electrode layer, and a variable resistance layer, and each selection device layer comprises a chalcogenide switching material including $(Ge_xSe_{1-x})_ySb_{1-y}$, wherein x is equal to or greater than about 0.2 and less than about 0.5, and y is about 0.85 to about 0.95.

11. The variable resistance memory device of claim 10, wherein each selection device layer comprises the chalcogenide switching material further including at least one of carbon (C) and nitrogen (N) doped therein.

12. The variable resistance memory device of claim 10, wherein each selection device layer has ovonic threshold switching characteristics.

13. The variable resistance memory device of claim 10, wherein the first electrode lines are word lines and the second electrode lines are bit lines, or the first electrode lines are bit lines and the second electrode lines are word lines.

14. The variable resistance memory device of claim 10, further comprising a circuit area on a bottom side of the first electrode line layer, the circuit area including peripheral circuits or driving circuits for driving the plurality of first memory cells.

15. The variable resistance memory device of claim 10, wherein each of the first memory cell layer and the second memory cell layer comprises a stack of a lower electrode layer, a selection device layer, a middle electrode layer, a heating element layer, a variable resistance layer and an upper electrode layer.

16. A variable resistance memory device comprising:
a first electrode layer;
a selection device on the first electrode layer, the selection device including a chalcogenide switching material including Ge and Se, wherein the atomic percentage of Ge content is less that of the atomic percentage of Se content, and at least one other element, except As, is included to improve one or more operating characteristics of said selection device;
a second electrode layer on the selection device;
a variable resistance layer on the second electrode layer, the variable resistance layer including a chalcogenide material; and
a third electrode on the variable resistance layer.

17. The variable resistance memory device of claim 16, wherein said at least one other element comprises Sb.

18. The variable resistance memory device of claim 17, wherein said one or more operating characteristics include a switching characteristic.

19. The variable resistance memory device of claim 18, wherein the atomic percentage of Sb is greater than 15%.

20. The variable resistance memory device of claim 19, wherein the chalcogenide switching material includes at least one of a carbon (C) dopant and a nitrogen (N) dopant.

* * * * *